(12) United States Patent
Kohli et al.

(10) Patent No.: US 7,736,983 B2
(45) Date of Patent: Jun. 15, 2010

(54) HIGH THRESHOLD NMOS SOURCE-DRAIN FORMATION WITH AS, P AND C TO REDUCE DAMAGE

(75) Inventors: Puneet Kohli, Austin, TX (US); Manoj Mehrotra, Plano, TX (US); Shaoping Tang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 11/972,417

(22) Filed: Jan. 10, 2008

(65) Prior Publication Data

US 2009/0179280 A1    Jul. 16, 2009

(51) Int. Cl.
*H01L 21/336* (2006.01)

(52) U.S. Cl. .................. 438/303; 438/301; 438/305; 257/369; 257/408

(58) Field of Classification Search .......... 438/301, 438/303, 305, 306; 257/369, 408, E21.409, 257/E29.255
See application file for complete search history.

(56) References Cited

U.S. PATENT DOCUMENTS

| | | | | |
|---|---|---|---|---|
| 5,918,127 A | * | 6/1999 | Lee et al. ................ | 438/278 |
| 6,013,546 A | * | 1/2000 | Gardner et al. .......... | 438/231 |
| 6,720,227 B1 | * | 4/2004 | Kadosh et al. .......... | 438/305 |
| 7,407,850 B2 | * | 8/2008 | Venugopal et al. ...... | 438/216 |
| 2006/0148220 A1 | * | 7/2006 | Lindert et al. .......... | 438/514 |

* cited by examiner

*Primary Examiner*—Phuc T Dang
(74) *Attorney, Agent, or Firm*—Jacqueline J. Garner; Wade J. Brady, III; Frederick J. Telecky, Jr.

(57) ABSTRACT

Pipe defects in n-type lightly doped drain (NLDD) regions and n-type source/drain (NDS) regions are associated with arsenic implants, while excess diffusion in NLDD and NSD regions is mainly due to phosphorus interstitial movement. Carbon implantation is commonly used to reduce phosphorus diffusion in the NLDD, but contributes to gated diode leakage (GDL). In high threshold NMOS transistors GDL is commonly a dominant off-state leakage mechanism. This invention provides a method of forming an NMOS transistor in which no carbon is implanted into the NLDD, and the NSD is formed by a pre-amorphizing implant (PAI), a phosphorus implant and a carbon species implant. Use of carbon in the NDS allows a higher concentration of phosphorus, resulting in reduced series resistance and reduced pipe defects. An NMOS transistor with less than $1 \cdot 10^{14}$ cm$^{-2}$ arsenic in the NSD and a high threshold NMOS transistor formed with the inventive method are also disclosed.

20 Claims, 17 Drawing Sheets

HIGH THRESHOLD NMOS SOURCE-DRAIN FORMATION WITH AS, P AND C TO REDUCE DAMAGE

FIELD OF THE INVENTION

This invention relates to the field of integrated circuits. More particularly, this invention relates to formation of source and drain elements of n-channel MOS transistors in integrated circuits.

BACKGROUND OF THE INVENTION

It is well known that dimensions of transistors in integrated circuits (ICs) are shrinking with each new generation of fabrication technology, as articulated in Moore's Law. Source and drain elements of MOS transistors are shrinking in both lateral and vertical directions, requiring tighter control over dopant distributions to maintain transistor performance parameters such as on-state drive current and off-state leakage current. Source and drain elements of n-channel MOS transistors typically include two sub-elements: a shallow, lightly doped region, commonly known as the n-type lightly doped drain (NLDD) closest to the MOS transistor channel region, and a deeper, heavily doped region commonly known as the n-type source/drain (NSD), which is typically laterally separated from the MOS transistor channel region. The NLDD and NSD sub-elements are formed separately. NLDD and NSD sub-elements of n-channel MOS transistors are formed by ion implanting n-type dopants into a p-type region of the surface of a silicon wafer. In addition, p-type dopants are typically ion implanted at an angle during the NLDD formation process, commonly known as a halo implant, to reduce the short channel effect. Commonly used n-type dopants are arsenic (As) and phosphorus (P). Phosphorus has a disadvantage for use in the NLDD and NSD, which arises from the high diffusivity of P atoms in silicon. After the n-type dopants are ion implanted into the NLDD or NSD, the wafer is annealed at high temperature to repair the silicon crystal lattice damage done by the ion implantation process. During the anneal, P atoms diffuse away from the implanted NLDD or NSD region into the transistor body region, further degrading on-state drive current and off-state leakage current. A common p-type dopant for halo implants is boron (B), which has the same disadvantage of high diffusivity as phosphorus. Carbon may be implanted into the NLDD to reduce the diffusion of P and B atoms during an anneal. However, carbon atoms in the NLDD space charge region contribute to diode leakage current, known as gated diode leakage (GDL). Arsenic is also commonly ion implanted into NLDD and NSD regions for n-channel MOS transistors. However, arsenic has a disadvantage of causing damage to the silicon crystal lattice during ion implantation, which is correlated with formation of metal silicide defects, known as pipes, which cause undesirable high off-state leakage current, and failures in static random access memory (SRAM) bits. Typical NLDD and NSD fabrication processes balance doses of phosphorus and arsenic to minimize the total impact to transistor on-state drive current and off-state leakage current. Lighter As or P doses in NLDD and NSD implants to reduce the deleterious effects produce undesirable higher series resistance in the transistor.

It is common for ICs to have two types of NMOS transistors: the second type has a higher threshold than the first type. High threshold NMOS is typically formed by the same process sequence as core NMOS, with the exception that high threshold NMOS receives an extra dose of p-type dopants in the region immediately under a gate to increase the threshold voltage. High threshold NMOS has lower off-state leakage current than core NMOS. GDL from the reverse biased junction between the drain and the p-type channel region is a dominant source of off-state leakage current in high threshold NMOS transistors, which is undesirable for IC performance.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

Applicant recognizes the desirability of forming NMOS transistors and high threshold NMOS transistors with reduced off-state leakage current, reduced GDL and reduced occurrence of pipe defects. The instant invention provides a method of forming an NMOS transistor in which no carbon is implanted into the NLDD, and the NSD is formed by a pre-amorphizing implant (PAI), a phosphorus implant and a carbon species implant. In an alternate embodiment, a high threshold NMOS transistor may be formed according to the inventive method. In a further embodiment, the NSD may contain less than $1 \cdot 10^{14}$ cm$^{-2}$ arsenic. In another embodiment, the PAI may be accomplished with a phosphorus implant. An NMOS transistor formed according to the inventive method, and a method of forming an integrated circuit incorporating the inventive method are also disclosed.

DETAILED DESCRIPTION

Figure 1A:
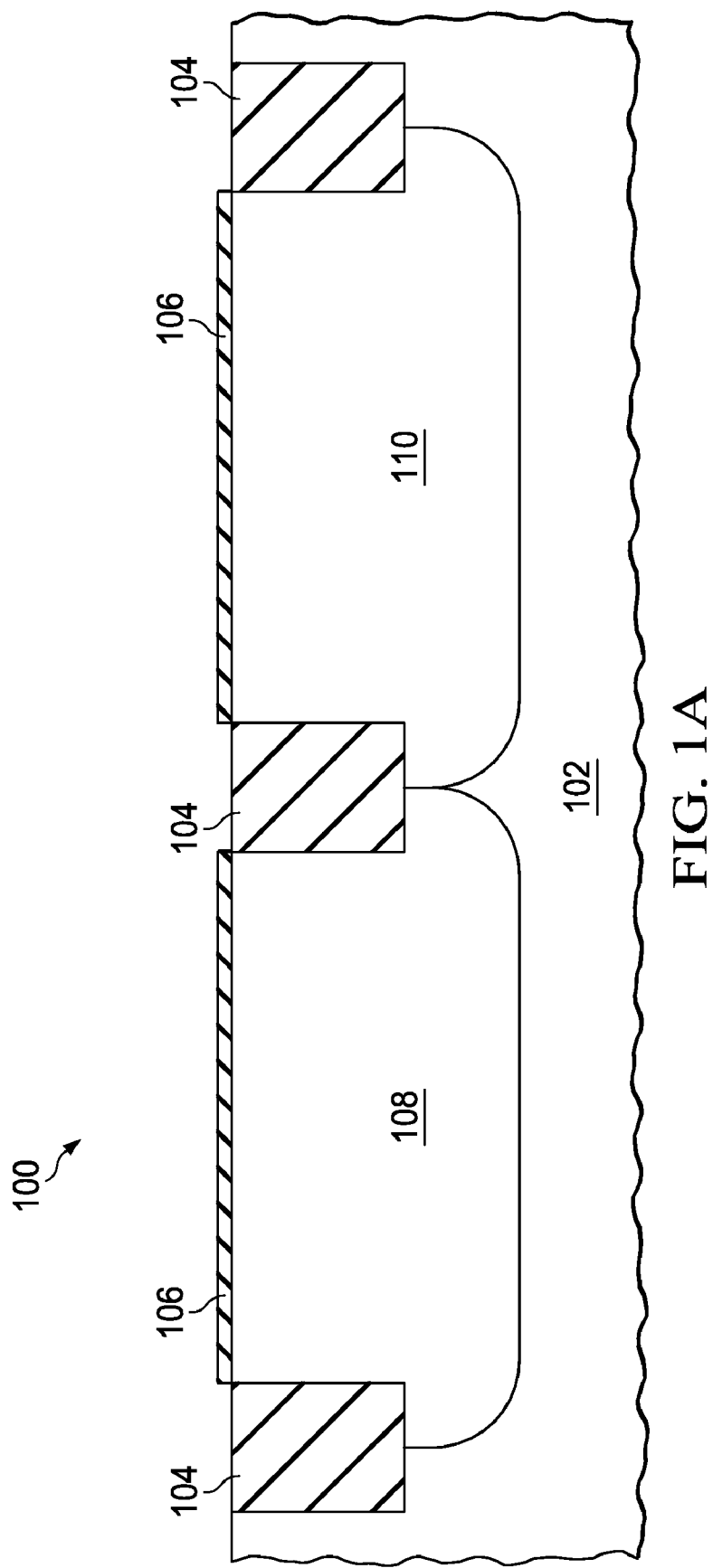
FIG. 1A through FIG. 1I are cross-sections of an IC containing an NMOS transistor and a p-channel MOS (PMOS) transistor during formation of an NSD according to a first embodiment invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a method of forming an n-channel MOS (NMOS) transistor in which no carbon is implanted in the NLDD or halo, and the NSD is formed using a pre-amorphization implant (PAI), phosphorus implants and carbon implants. This is advantageous because carbon implanted into the NSD can inhibit phosphorus diffusion in the NLDD and boron diffusion in the halo while avoiding the problem of gated diode leakage due to carbon in the NLDD space charge region. In a first embodiment, no arsenic is implanted in the NSD. In an alternate embodiment, a high threshold NMOS transistor is formed according to the inventive method. In a further embodiment, an NMOS transistor is formed in which arsenic is implanted into the NSD with a total dose less than $1 \cdot 10^{14}$ cm$^{-2}$. In another embodiment, the PAI is accomplished with a phosphorus implant.

NMOS transistor source and drain elements are commonly formed of two sub-elements, an n-type lightly doped drain (NLDD) and an n-type source/drain (NSD). The NLDD is formed after a gate of the NMOS transistor is defined over a p-well by etching, oxidation, and possible additional thin spacer elements, typically less than 10 nanometers thick, on the gate surface. N-type dopants are implanted into the p-well adjacent to the gate. Typically, a high dose, greater than $1 \cdot 10^{15}$ cm$^{-2}$, low energy implant, known as a pre-amorphization implant (PAI) precedes the n-type dopant implant to amorphize the surface region of the NLDD and thereby reduce channeling of the following n-type dopant implant atoms. In addition, p-type dopant atoms, typically boron, are commonly halo implanted at an angle in quarter doses with a four-way rotation around a vertical axis during the NLDD formation to reduce the short channel effect. Commonly, the NMOS transistor is annealed after the NLDD implants are completed to repair the lattice damage done by the implants, which results in spreading of the n-type dopant atoms and p-type dopant atoms by diffusion. After the NLDD is formed, a thick spacer is formed on side surfaces of the gate, known as the gate sidewall spacer, which is typically tens of nanometers thick. The NSD is formed by implanting additional n-type dopants into the p-well at higher doses and higher energies than the NLDD implants. A PAI may be used to reduce channeling of the n-type dopant atoms. The transistor is annealed after the NSD implants are completed. The gate sidewall spacer prevents n-type dopants in the NSD from encroaching on a transistor channel region under the gate.

Dopant atoms diffuse in silicon by various mechanisms, two important mechanisms being interstitial diffusion and vacancy diffusion. Interstitial diffusion occurs when dopant atoms, such as arsenic or phosphorus atoms, are situated between silicon atoms in the crystal lattice, and are not occupying lattice sites; such atoms are said to be in interstitial sites or "interstitial." In such a configuration, the interstitial dopant atoms may move, or diffuse, through the silicon crystal lattice. Smaller dopant atoms, such as phosphorus atoms, diffuse interstitially more rapidly at a given temperature than larger dopant atoms, such as arsenic atoms. Interstitial movement by an atom typically ends when it moves into a vacancy in the silicon crystal lattice, becoming "substitutional," that is, occupying a lattice site formerly occupied by a silicon atom. Atoms in substitutional sites have lower free energy than interstitial atoms, and are thus more stable. Vacancy diffusion occurs when a substitutional dopant atom moves to a nearby vacancy in the silicon crystal lattice. Both vacancy and interstitial diffusion increase strongly with temperature, so that all significant diffusion occurs during anneals. Vacancy diffusion is the primary mechanism for arsenic, while interstitial diffusion is the primary mechanism for phosphorus and boron. In the case of implanted dopant atoms in an amorphized region, additional mechanisms come into play during an anneal. At anneal temperatures, typically over 1000 C, the amorphized region shrinks as the amorphous silicon crystallizes at the boundary between the amorphized region and the crystal region. As the amorphous-crystalline boundary passes implanted dopant atoms and other impurity atoms (atoms other than silicon), they primarily occupy lattice sites and become substitutional atoms. There is a large number of interstitial silicon atoms present (typically $>10^{21}$ cm$^{-3}$) at the amorphous-crystalline boundary, which can exchange places with the substitutional dopant atoms, and thus promote interstitial diffusion. It has been shown that implanting carbon, typically at doses higher than $2 \cdot 10^{14}$ cm$^{-2}$, reduces the concentration of interstitial silicon at the interface by the following mechanism: implanted carbon atoms phosphorus atoms and arsenic atoms in the amorphous region first become substitutional as the amorphous region recrystallizes during anneal; the substitutional carbon rapidly exchanges places with interstitial silicon atoms, reducing the interstitial silicon atom density and forming interstitial carbon. Interstitial carbon does not readily exchange places with substitutional phosphorus or arsenic atoms, unlike interstitial silicon, so interstitial diffusion of B, P and As is reduced by the action of the carbon. Because the primary diffusion mechanism for phosphorus and boron is interstitial, implanting carbon in doses above $2 \cdot 10^{14}$ cm$^{-2}$ reduces phosphorus and boron diffusion by greater factors than arsenic diffusion. The thermal equilibrium solubility for substitutional carbon in a silicon crystal lattice is below a level to significantly inhibit phosphorus interstitial diffusion, so it is necessary to amorphize the silicon and implant the carbon into the amorphous layer to obtain the desired level of substitutional carbon during anneal, by the same mechanism discussed above. This phenomenon is exploited in the instant invention to increase the amount of phosphorus in an NSD without the attendant disadvantage of large diffusion lengths during anneal.

FIG. 1A through FIG. 1I are cross-sections of an IC containing an NMOS transistor and a p-channel MOS (PMOS) transistor during formation of an NSD according to a first embodiment of the instant invention. FIG. 1A depicts the IC after wells for the NMOS and PMOS transistors have been formed. IC (100) includes a semiconductor substrate (102), typically silicon, but possibly silicon-germanium, commonly p-type with an electrical resistivity of 1 to 100 ohm-cm. Regions of field oxide (104), typically silicon dioxide, commonly fabricated by shallow trench isolation (STI) processes or less commonly local oxidation of silicon (LOCOS) processes, are formed in the semiconductor substrate (102) to separate transistors and other components. A layer of sacrificial oxide (106) commonly known as pad oxide or dummy oxide, typically 5 to 50 nanometers of silicon dioxide formed by thermal oxidation, is formed on a top surface of the semiconductor substrate (102) to protect the top surface of the semiconductor substrate (102) and to reduce channeling of atoms in subsequent ion implantation steps. A p-type well (108), commonly known as a p-well, is formed in the semiconductor substrate (102), typically by ion implantation of p-type dopants, most commonly boron or BF$_2$, in several steps with doses from $1 \cdot 10^{10}$ cm$^{-2}$ to $1 \cdot 10^{13}$ cm$^{-2}$, at energies from 5 keV to 300 keV. Similarly, an n-type well (110), commonly known as an n-well, is formed in the semiconductor substrate (102), typically by ion implantation of n-type dopants, most commonly phosphorus, arsenic and antimony, in several steps with doses from $1 \cdot 10^{10}$ cm$^{-2}$ to $1 \cdot 10^{13}$ cm$^{-2}$, at energies from 5 keV to 800 keV.

Figure 1B:
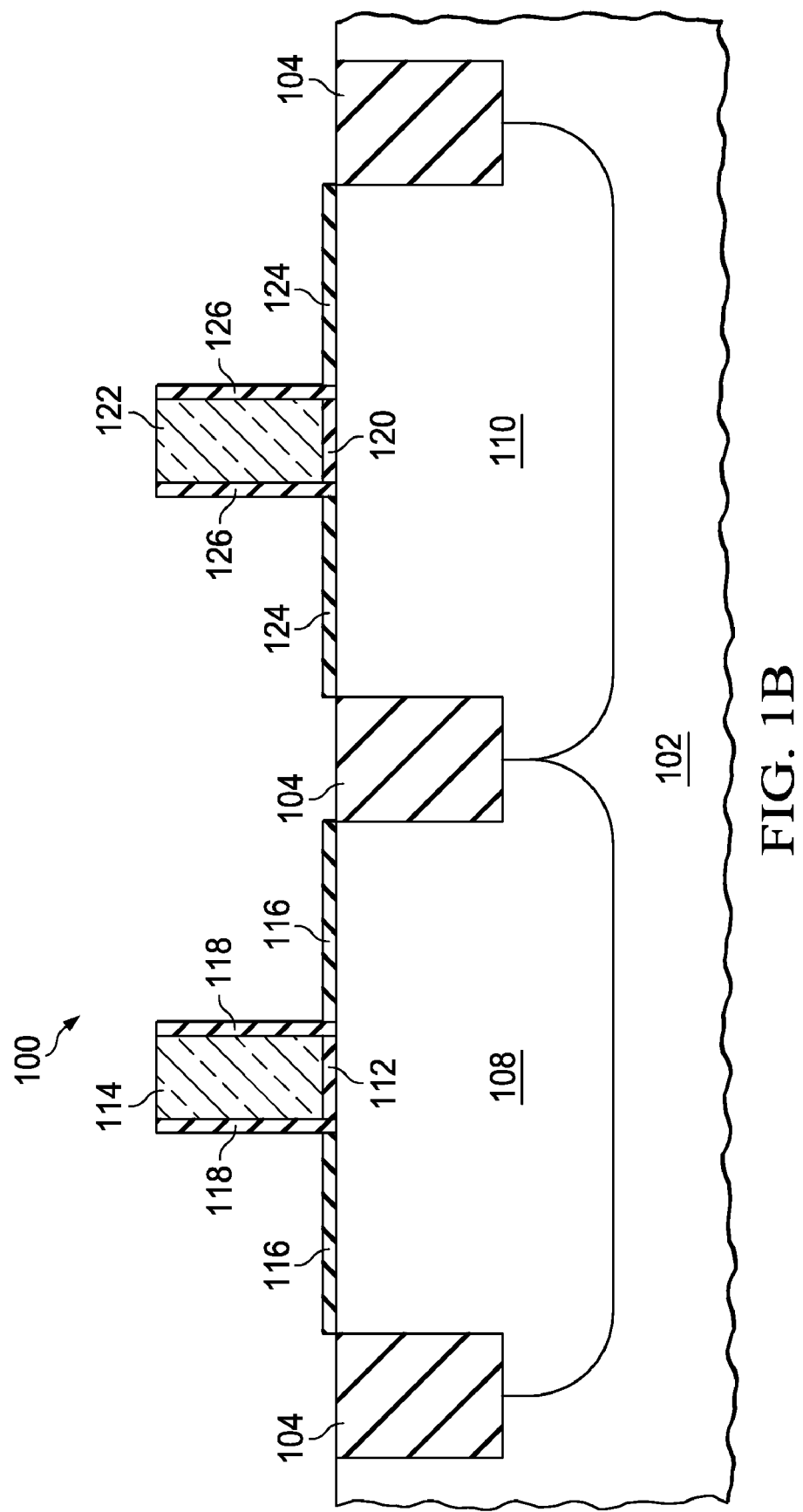

FIG. 1B depicts the IC (100) after gate formation. Fabrication of the NMOS transistor proceeds as an NMOS gate dielectric layer (112), typically silicon dioxide, nitrogen doped silicon dioxide, silicon oxy-nitride, haffnium oxide, layers of silicon dioxide and silicon nitride, or other insulating material, commonly 1.2 to 2.5 nanometers thick, is formed on a top surface of the p-well (108). An NMOS gate (114) is formed by deposition of gate material, typically polycrystalline silicon, commonly known as polysilicon, on a top surface of the NMOS gate dielectric layer (112), followed by formation of a photoresist pattern to define the NMOS gate region, followed by an etch process to removed unwanted gate material. An NMOS residual oxide layer (116) is formed on the top surface of the p-well (108) adjacent to the NMOS gate (114). NLDD offset spacers (118), typically 3 to 10 nanometers thick, are formed on lateral surfaces of the NMOS gate (114), commonly by growth and/or deposition of silicon dioxide and/or silicon nitride followed by selective anisotropic etchback.

Still referring to FIG. 1B, fabrication of the PMOS transistor proceeds by formation of a PMOS gate dielectric layer (120), typically silicon dioxide, nitrogen doped silicon dioxide, silicon oxy-nitride, hafnium oxide, layers of silicon dioxide and silicon nitride, or other insulating material, commonly 1.2 to 2.5 nanometers thick, on the top surface of the n-well (110). The PMOS gate dielectric layer (120) may have a different composition and/or thickness than the NMOS gate dielectric layer (112). A PMOS gate (122) is formed by deposition of gate material, typically polysilicon, on a top surface of the PMOS gate dielectric layer (120), followed by formation of a photoresist pattern to define the PMOS gate region, followed by an etch process to removed unwanted gate material. The PMOS gate (122) may have a different linewidth than the NMOS gate (114). A PMOS residual oxide layer (124) is formed on the top surface of the n-well (110) adjacent to the PMOS gate (122). PLDD offset spacers (126), typically 3 to 10 nanometers thick, are formed on lateral surfaces of the PMOS gate (122), commonly by growth and/or deposition of silicon dioxide and/or silicon nitride followed by selective anisotropic etchback. The PLDD offset spacers (126) may have a different composition and/or thickness than the NLDD offset spacers (118).

Figure 1C:
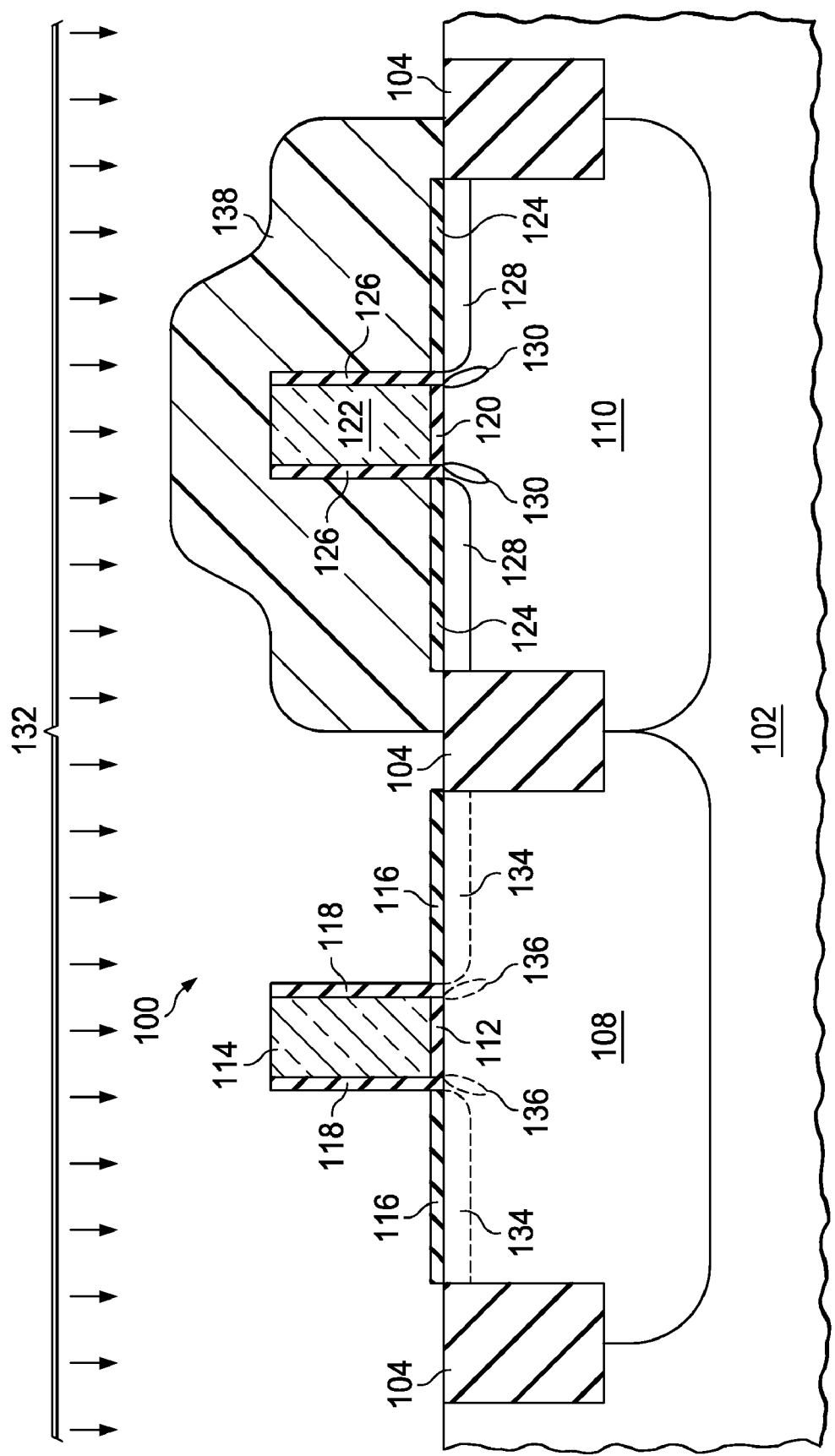

FIG. 1C depicts the IC (100) at a further stage of fabrication. PMOS LDD (PLDD) regions (128) are formed in a top region of the n-well (110) adjacent to the PLDD offset spacers (126) by ion implantation of p-type dopants, typically boron, at doses of $1 \cdot 10^{13}$ to $1 \cdot 10^{15}$ cm$^{-2}$, and commonly to a depth of 10 to 100 nanometers. N-type PMOS pocket regions (130) are formed between the PLDD regions (128) an a channel region in the n-well (110) immediately under the PMOS gate dielectric layer (120), by angled ion implantation of n-type dopants such as phosphorus and arsenic, at doses of $1 \cdot 10^{11}$ to $1 \cdot 10^{13}$ cm$^{-2}$, and commonly to a depth of 10 to 100 nanometers. Ion implants used to form the PLDD and PMOS pocket regions (124, 126) are blocked from the NMOS transistor region by a photoresist pattern (not shown in FIG. 1C for clarity).

Still referring to FIG. 1C, NLDD n-type dopants (132), typically phosphorus and arsenic, at doses of $1 \cdot 10^{13}$ to $1 \cdot 10^{15}$ cm$^{-2}$, are being ion implanted into a top region of the p-well (106), commonly at depths of 10 to 100 nanometers, to form NLDDs (134) adjacent to the NLDD offset spacers (118). According to the instant invention, no carbon containing species are implanted into the NLDDs (134), to reduce GDL due to mid-bandgap states in the NLDD space charge region. P-type NMOS pocket regions (136) are formed between the NLDD regions (134) and a channel region in the p-well (108) immediately under the NMOS gate dielectric layer (112), by angled ion implantation of p-type dopants such as boron and gallium, at doses of $1 \cdot 10^{11}$ to $1 \cdot 10^{13}$ cm$^{-2}$, and commonly to a depth of 10 to 100 nanometers. The NLDD n-type dopants (132) are blocked from the PMOS transistor region by an NLDD photoresist pattern (138).

It is common to anneal the NLDD, PLDD, NMOS pocket and PMOS pocket implants to reduce damage done to a silicon crystal lattice by the implant processes, and to activate a portion of the implanted dopants. In a preferred embodiment, the thermal profile (time and temperature) of this anneal is adjusted to achieve repair of the silicon crystal lattice while minimizing spreading of the implanted dopants by interstitial and vacancy diffusion. For example, an anneal of 900 C for 10 seconds may be sufficient to repair the silicon crystal lattice for subsequent processing.

Figure 1D:
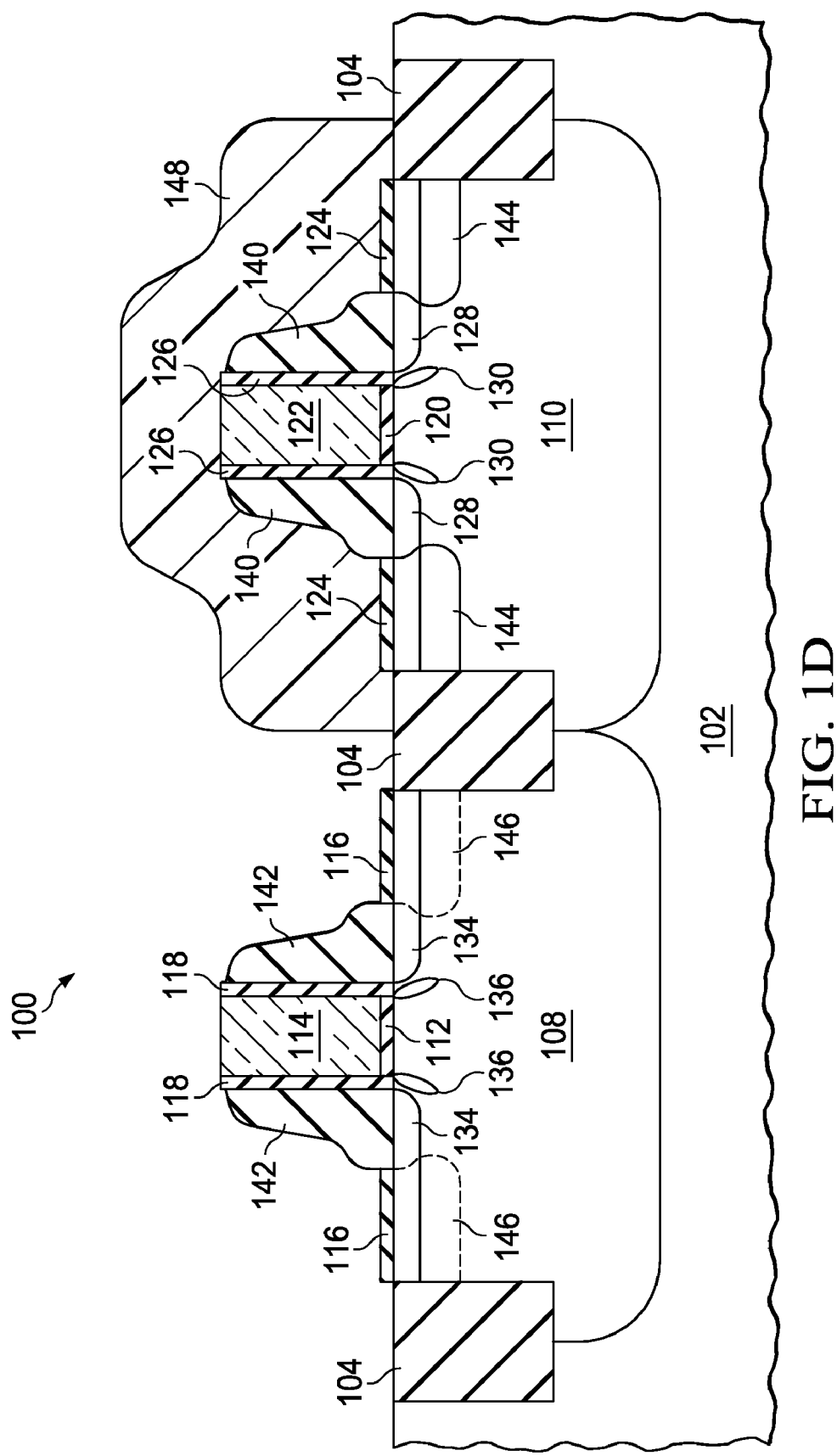

FIG. 1D depicts the IC (100) during the formation of NMOS and PMOS source and drain regions. PMOS gate sidewall spacers (140) are formed on lateral surfaces of the PLDD offset spacers (126), typically 10 to 100 nanometers thick, commonly formed by deposition of layers of silicon dioxide and silicon nitride followed by selective anisotropic etchback. Similarly, NMOS gate sidewall spacers (142) are formed on lateral surfaces of the NLDD offset spacers (118), typically 10 to 100 nanometers thick, commonly formed by deposition of layers of silicon dioxide and silicon nitride followed by selective anisotropic etchback. The thickness and composition of the PMOS gate sidewall spacers (140) may be different than the NMOS gate sidewall spacers (142).

Still referring to FIG. 1D, PMOS source and drain (PSD) regions (144) are formed in the n-well (110) adjacent to the PMOS gate sidewall spacers (140) by ion implanting p-type dopants such as boron at doses typically ranging from $1 \cdot 10^{14}$ to $1 \cdot 10^{16}$ cm$^{-2}$, and commonly to a depth of 20 to 300 nanometers.

Continuing with reference to FIG. 1D, formation of the NSD regions (146) is accomplished according to a first embodiment of the instant invention by a sequence of ion implantation steps, including a PAI, a carbon implant at a dose greater than $2 \cdot 10^{14}$ cm$^{-2}$, and a phosphorus implant, followed by an NSD anneal. These implants are blocked from the PMOS transistor region by an NSD photoresist pattern (148). The specific implant processes and the NSD anneal will de discussed in reference to FIG. 1E through FIG. 1G, below.

Figure 1E:
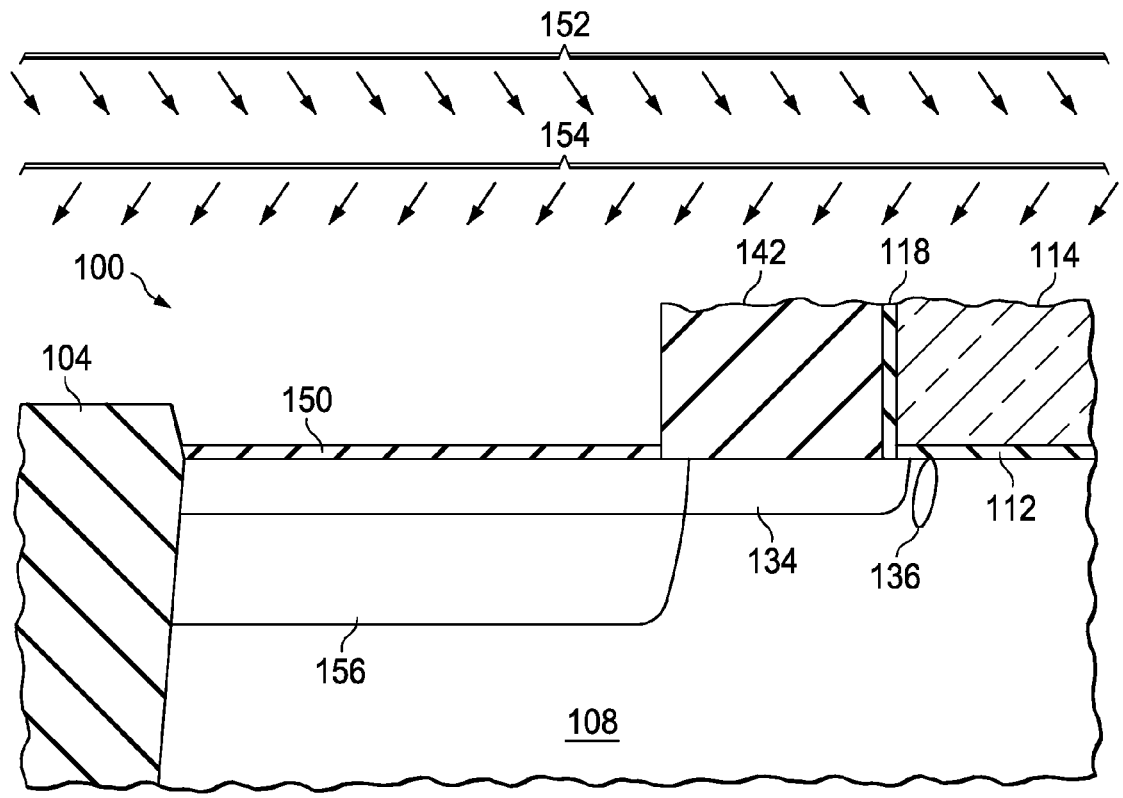

FIG. 1E depicts one side of the NMOS source and drain region during the PAI process. A sacrificial oxide layer (150), typically 1 to 20 nanometers of silicon dioxide, is formed on the top surface of the p-well adjacent to the NMOS gate (114). The purpose of a PAI is to amorphize a region at the top surface of the p-well (108) adjacent to the NMOS gate sidewall spacers (142). A species implanted in a PAI may be chosen from a long list of materials, including group IV elements such as germanium or silicon, heavy dopant atoms such as antimony or indium, or inert gases such as argon. In a further embodiment, a dose of the PAI is greater than $1 \cdot 10^{15}$ cm$^{-2}$. PAI processes typically tilt an ion implant beam at an angle to the top surface of the p-well to avoid channeling a first group of atoms. Angled implants result in shadowed regions adjacent to structures over the top surface of the p-well, such as the NMOS gate or a photoresist pattern, so angled implants such as a PAI are commonly divided into four equal doses and each is implanted a same tilt angle that is rotated at 90 degree intervals around a vertical axis with respect to the top surface of the p-well. A first angled quarter dose, of four, of an NSD PAI is schematically depicted in FIG. 1E by (152). A second angled quarter dose, of four, of the NSD PAI is schematically depicted in by (154). The implants (152, 154) form an NSD amorphous layer (156) in the top surface of the p-well (108) adjacent to the NMOS gate sidewall spacers (142). The NSD amorphous layer (156) is deeper than the NLDD layer because the NSD will be deeper than the NLDD.

Figure 1F:
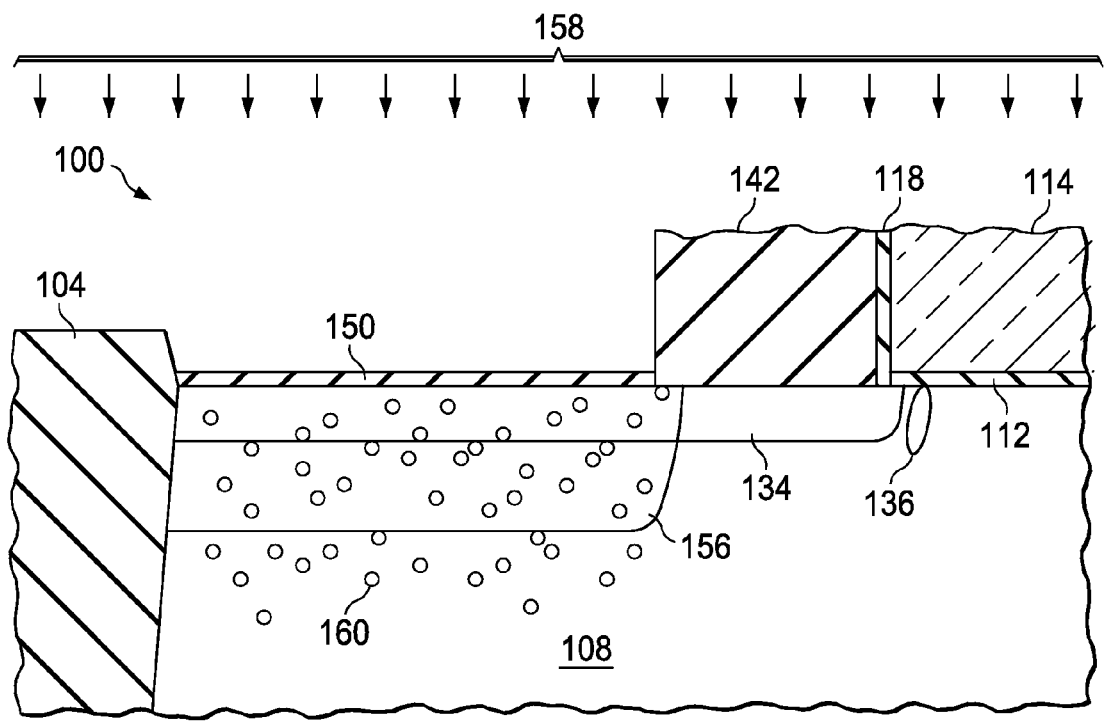

FIG. 1F is a sectional view of the IC (100), expanded to show one side of the NMOS transistor for purposes of clarity, during a carbon ion implantation process. The purpose of the carbon implant is to inhibit phosphorus diffusion. An NSD carbon species implant (158) places carbon atoms (160) in the top region of the p-well (108) adjacent to the NMOS gate sidewall spacer (142). An ion energy of the NSD carbon species implant (158) is adjusted to place the majority of the carbon atoms (160) in the NSD amorphous layer (156), using well known techniques. In a further embodiment, a dose of the NSD carbon species implant (158) is more than $2 \cdot 10^{14}$ $cm^{-2}$. An alternate embodiment includes a dose greater than $5 \cdot 10^{14}$ $cm^{-2}$ to further reduce phosphorus diffusion.

Figure 1G:
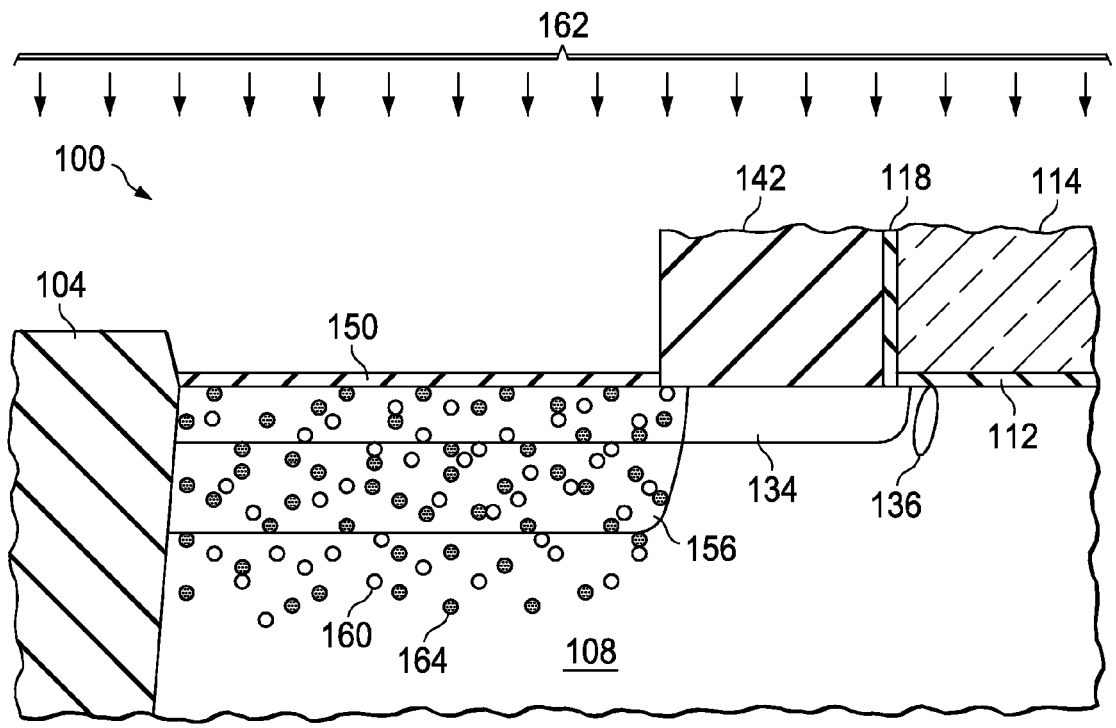

FIG. 1G is a sectional view of the IC (100), expanded to show one side of the NMOS transistor for purposes of clarity, during a phosphorus ion implantation process. Formation of the NSD continues with ion implantation of phosphorus atoms (162) into the top region of the p-well (108) adjacent to the NMOS gate sidewall spacer (142) to provide n-type dopants for the NSD, in the form of phosphorus atoms (164). The use of phosphorus rather than arsenic for n-type dopants for the NSD is advantageous because it avoids the damage done by arsenic implantation, which is associated with pipe formation during metal silicidation, resulting in excess transistor off-state current leakage. An ion energy of the NSD phosphorus implant (162) is adjusted to place the majority of the phosphorus atoms (164) in the NSD amorphous layer (156), using well known techniques. Channeling of phosphorus atoms is significantly reduced by the presence of the NSD amorphous layer (156). A dose of the NSD phosphorus implant (162) is commonly in the range of $1 \cdot 10^{14}$ to $3 \cdot 10^{16}$ $cm^{-2}$, as determined by the performance requirements of the transistor.

Figure 1H:
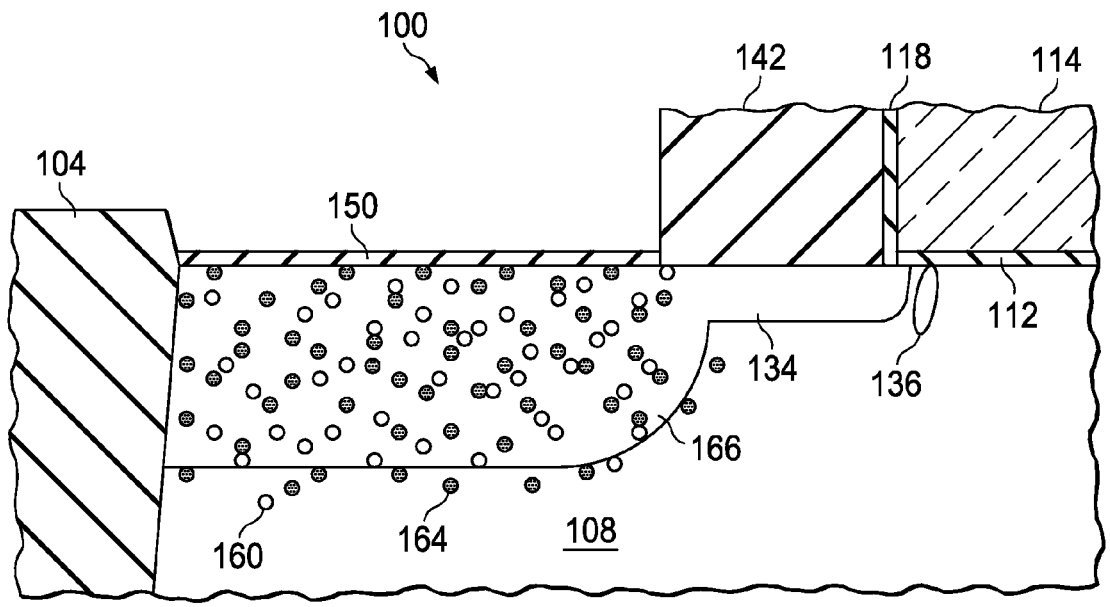

FIG. 1H is a sectional view of the IC (100), expanded to show one side of the NMOS transistor for purposes of clarity, after an NSD anneal process. The purpose of the NSD anneal is to repair the damage to the silicon crystal done by the NSD PAI, NSD carbon species implant and NSD phosphorus implant, and activate a plurality of the phosphorus atoms (164) as n-type dopants. Activation of the phosphorus atoms as n-type dopants has formed the NSD (166), which is an n-type region in the top region of the p-well (108) adjacent to the NMOS gate sidewall spacer (142). During the NSD anneal, as the NSD amorphous region crystallizes, carbon atoms (160) and phosphorus atoms (164) occupy substitutional sites. Substitutional carbon atoms rapidly exchange places with interstitial silicon, reducing the concentration of interstitial silicon at a boundary of the NSD amorphous and p-well crystalline regions. The resultant reduction of interstitial silicon results in formation of fewer interstitial phosphorus atoms, which in turn results in less phosphorus interstitial diffusion compared to an NSD with no implanted carbon atoms. This is advantageous because reduced phosphorus diffusion results in higher transistor on-state drive current and lower transistor off-state leakage current. An additional advantage of the instant embodiment accrues from the presence of carbon atoms from the NSD carbon species implant in the region of the NLDD, which reduce phosphorus and arsenic diffusion in the NLDD and boron diffusion in the NMOS pocket regions during the NSD anneal. In one embodiment, a dose of arsenic implanted into the NLDD is reduced to less than $5 \cdot 10^{14}$ $cm^{-2}$ and a dose of phosphorus implanted into the NLDD is increased to take advantage of the reduced diffusion in the NLDD due to the presence of carbon atoms in the NLDD and to reduce pipe defects associated with arsenic implantation.

A further advantage of the instant embodiment accrues from the fact that a higher concentration of phosphorus may be obtained in the NSD through the use of the carbon species ion implant than without, resulting in a desirable lower series resistance in the NMOS transistor.

It will be recognized by workers in transistor fabrication that the order of the NSD carbon species implant and the NSD phosphorus implant may be exchanged without loss of the benefits of the instant embodiment.

Figure 1I:
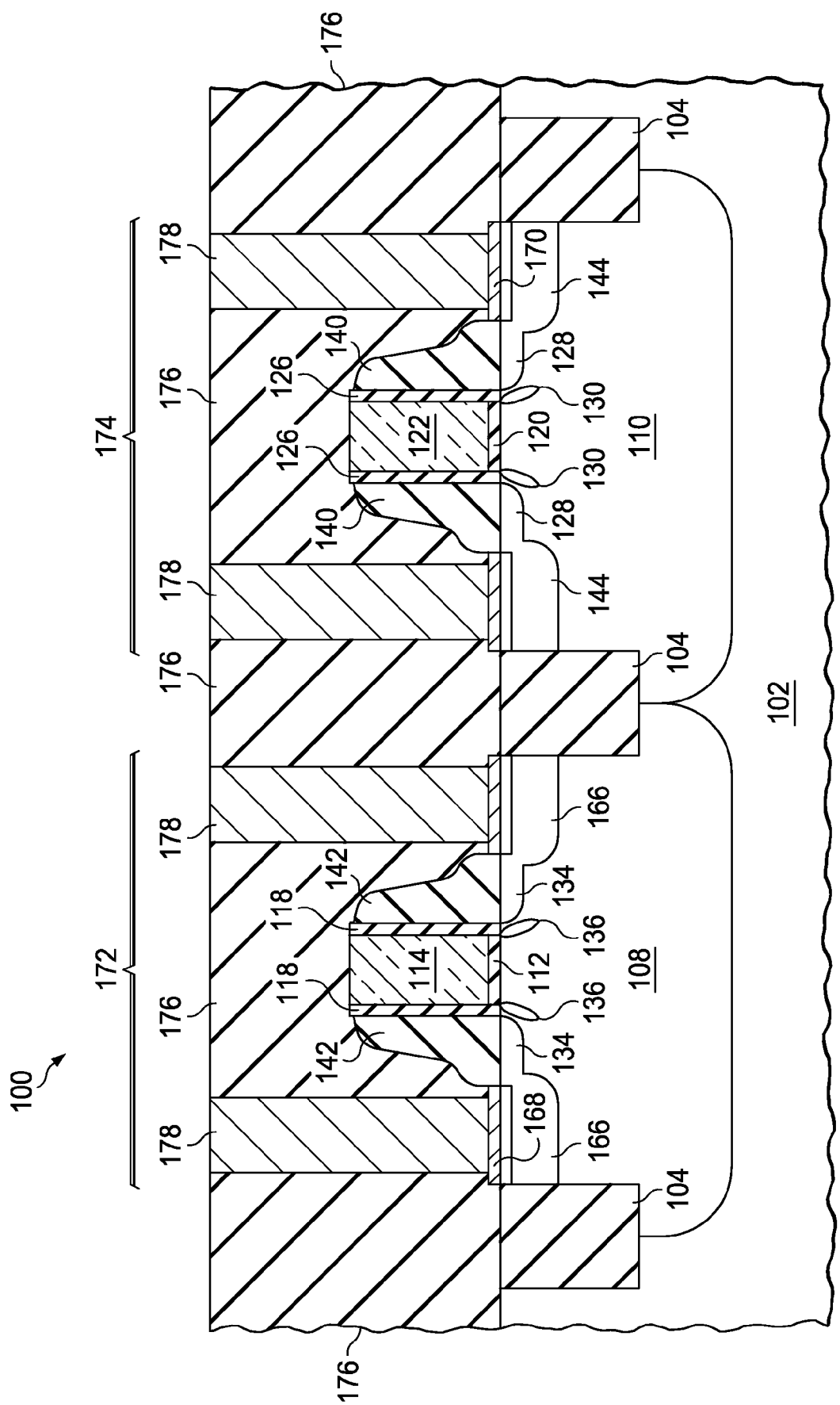

FIG. 1I depicts the IC (100) after completion of the NMOS and PMOS transistors, and formation of contacts. Metal silicide (164, 166), typically nickel silicide, cobalt silicide or titanium silicide, is formed on top surfaces of the NSD (166) and PSD (144), respectively, commonly by a process of deposition of a metal, such as nickel, cobalt or titanium, reaction at an elevated temperature to form a metal silicide in regions where the metal is in contact with silicon, such as the source and drain regions of MOS transistors, followed by selective removal of unreacted metal, and frequently followed by a second thermal process to achieve desired properties in the metal silicide, such as sheet resistance. A purpose of metal silicide formation is to reduce series resistances in MOS transistors.

Still referring to FIG. 1I, the NMOS gate dielectric layer (112), NMOS gate (114), NLDD offset spacers (118), NLDD regions (134), NMOS pocket regions (136), NMOS gate sidewall spacers (142), NSD regions (166) and NSD metal silicide layers (168) form an NMOS transistor (172). Similarly, the PMOS gate dielectric layer (120), PMOS gate (122), PLDD offset spacers (126), PLDD regions (128), PMOS pocket regions (130), PMOS gate sidewall spacers (140), PSD regions (144) and PSD metal silicide layers (170) form a PMOS transistor (174).

Continuing to refer to FIG. 1I, fabrication of the IC (100) continues with formation of a pre-metal dielectric (PMD) layer (176), typically 5 to 50 nanometers of a silicon nitride containing layer, capped with 300 to 1000 nanometers of silicon dioxide. Contacts (178), are formed by patterning and etching contact holes through the PMD to expose the metal silicide layers (164, 166), and filled with metal, typically tungsten, but in some cases aluminum or copper, commonly by a process of deposition followed by selective removal from a top surface of the PMD (176). The contacts (178) connect the NMOS transistor (172) and PMOS transistor (174) to other components in the IC (100) by metal interconnects (not shown).

Figure 2A:
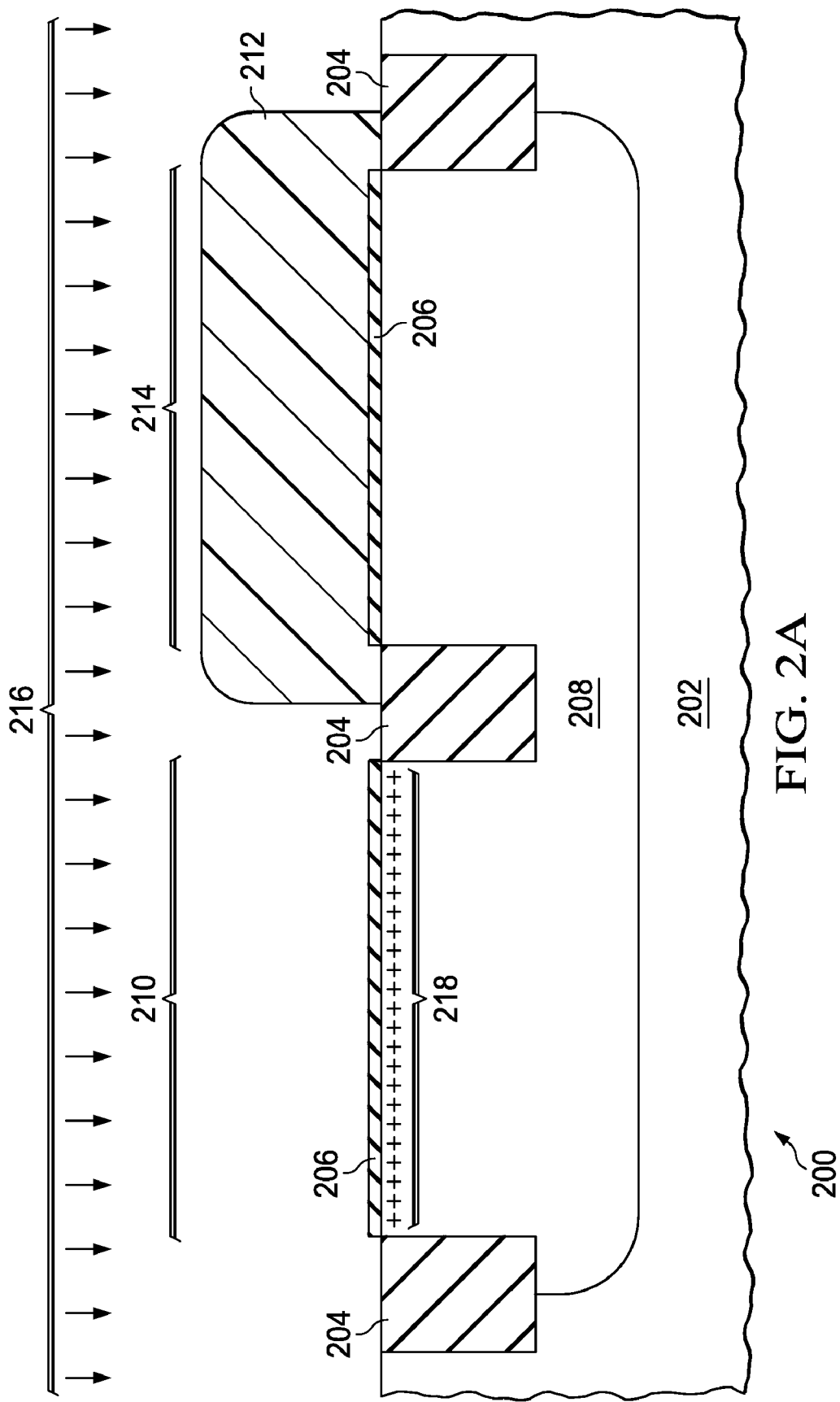
FIG. 2A through FIG. 2F are cross-sections of an IC containing a core NMOS transistor and a high threshold NMOS transistor during formation of a high threshold NSD according to an alternate embodiment of the instant invention.

In an alternate embodiment, a high threshold NMOS transistor is formed in which no carbon is implanted into the high threshold NLDD or pocket regions, and the high threshold NSD region is formed by a PAI, followed by a carbon implant and a phosphorus implant, followed by an NSD anneal. For the purposes of making the disclosure of the instant embodiment more readable, an NMOS transistor without an extra threshold implant will be referred to as a "core NMOS" transistor. FIG. 2A through FIG. 2F are cross-sections of an IC containing a core NMOS transistor and a high threshold NMOS transistor during formation of a high threshold NSD according to an alternate embodiment of the instant invention. FIG. 2A depicts an IC (200) containing a semiconductor substrate (202), typically silicon, but possibly silicon-germanium, commonly p-type with an electrical resistivity of 1 to 100 ohm-cm. Regions of field oxide (204), typically silicon dioxide, commonly fabricated by shallow trench isolation (STI) processes or less commonly local oxidation of silicon (LOCOS) processes, are formed in the semiconductor substrate (202) to separate transistors and other components. A layer of sacrificial oxide (206) commonly known as pad oxide or dummy oxide, typically 5 to 50 nanometers of silicon dioxide formed by thermal oxidation, is formed on a top surface of the semiconductor substrate (202) to protect the top surface of the semiconductor substrate (202) and to reduce channeling of atoms in subsequent ion implantation steps. A p-type well (208), commonly known as a p-well, is formed in the semiconductor substrate (202), typically by ion implantation of p-type dopants, most commonly boron or $BF_2$, in several steps with doses from $1 \cdot 10^{10}$ $cm^{-2}$ to $1 \cdot 10^{13}$ $cm^{-2}$, at energies from 5 keV to 300 keV. A high threshold NMOS region (210) is defined by a high threshold NMOS threshold adjustment photoresist pattern (212), which exposes the high threshold NMOS region (210) and covers a core NMOS region (214). FIG. 2A depicts a high threshold NMOS threshold adjustment ion implantation process in which p-type dopant atoms (216), typically boron, are ion implanted at doses of $1 \cdot 10^{10}$ $cm^{-2}$ to $1 \cdot 10^{12}$ $cm^{-2}$ into a top region, typically 1 to 30 nanometers deep, of the p-well (208) to form a high threshold p-type region (218). The implanted p-type dopant atoms in the high threshold p-type region (218) are activated by a subsequent anneal process.

Figure 2B:
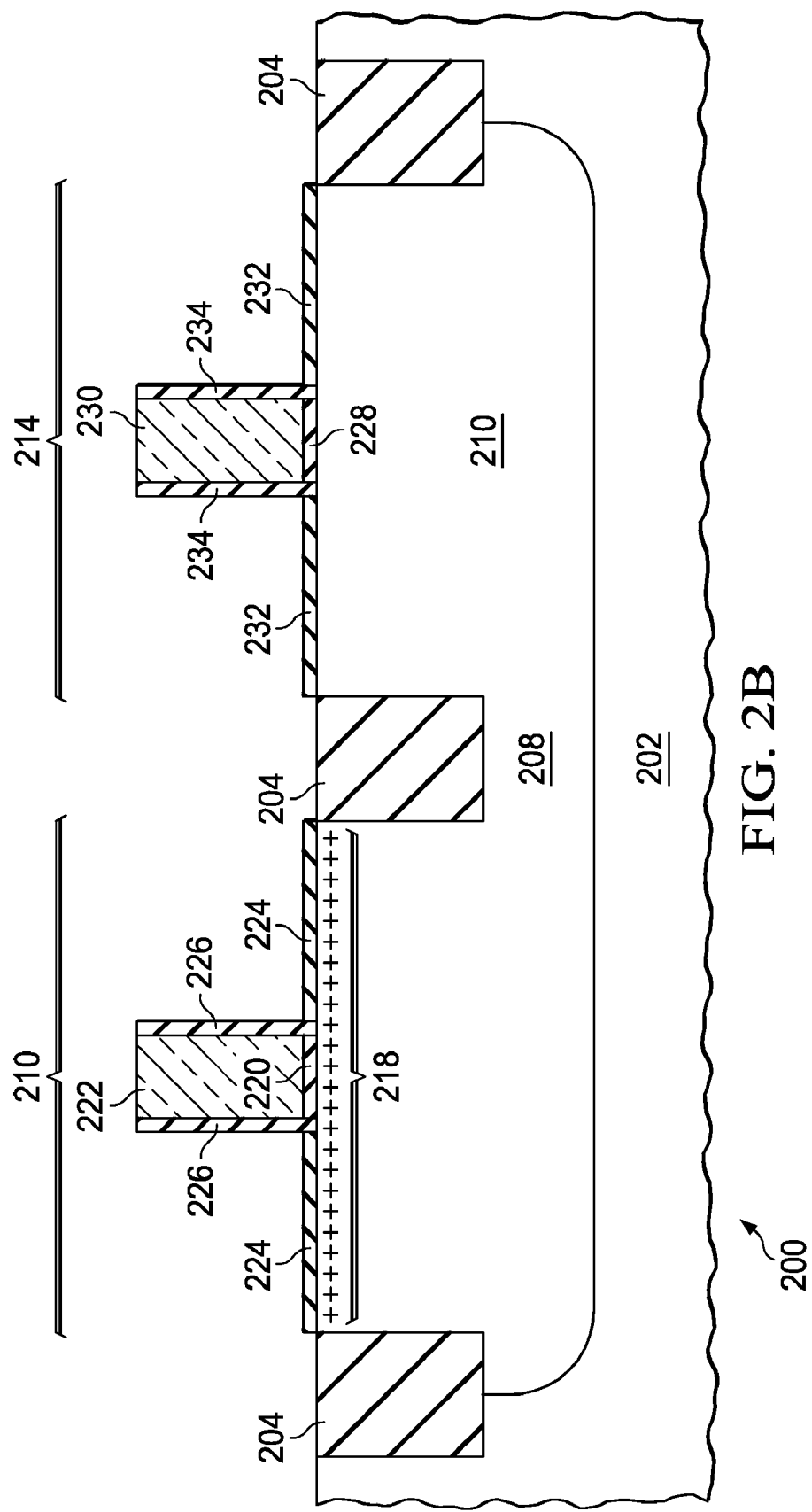

FIG. 2B depicts the IC (200) after gate formation. Fabrication of the high threshold NMOS transistor proceeds as a high threshold NMOS gate dielectric layer (220), typically silicon dioxide, nitrogen doped silicon dioxide, silicon oxynitride, hafnium oxide, layers of silicon dioxide and silicon nitride, or other insulating material, commonly 1.2 to 2.5 nanometers thick, is formed on a top surface of the p-well (208) in the high threshold NMOS region (210). A high threshold NMOS gate (222) is formed by deposition of gate material, typically polycrystalline silicon, commonly known as polysilicon, on a top surface of the high threshold NMOS gate dielectric layer (220), followed by formation of a photoresist pattern to define the high threshold NMOS gate region, followed by an etch process to removed unwanted gate material. A high threshold NMOS residual oxide layer (224) is formed on the top surface of the p-well (208) adjacent to the NMOS gate (222). High threshold NLDD offset spacers (226), typically 3 to 10 nanometers thick, are formed on lateral surfaces of the high threshold NMOS gate (222), commonly by growth and/or deposition of silicon dioxide and/or silicon nitride followed by selective anisotropic etchback. Similarly, a core NMOS gate dielectric layer (228), typically silicon dioxide, nitrogen doped silicon dioxide, silicon oxynitride, hafnium oxide, layers of silicon dioxide and silicon nitride, or other insulating material, commonly 1.2 to 2.5 nanometers thick, is formed on a top surface of the p-well (208) in the core NMOS region (214). A composition and/or thickness of the core NMOS gate dielectric layer (228) may be different from the high threshold NMOS gate dielectric layer (220). A core NMOS gate (230) is formed by deposition of gate material, typically polycrystalline silicon, commonly known as polysilicon, on a top surface of the core NMOS gate dielectric layer (228), followed by formation of a photoresist pattern to define the core NMOS gate region, followed by an etch process to removed unwanted gate material. Typically, a composition of the core NMOS gate (230) is substantially the same as the high threshold NMOS gate (222), but a gate length of core NMOS gate (230) may be shorter than the high threshold NMOS gate (222). A core NMOS residual oxide layer (232) is formed on the top surface of the p-well (208) adjacent to the core NMOS gate (230). Core NLDD offset spacers (234), typically 3 to 10 nanometers thick, are formed on lateral surfaces of the core NMOS gate (230), commonly by growth and/or deposition of silicon dioxide and/or silicon nitride followed by selective anisotropic etchback. Typically, a composition and thickness of the core NLDD offset spacers (234) is substantially the same as the high threshold NLDD offset spacers (226).

Figure 2C:
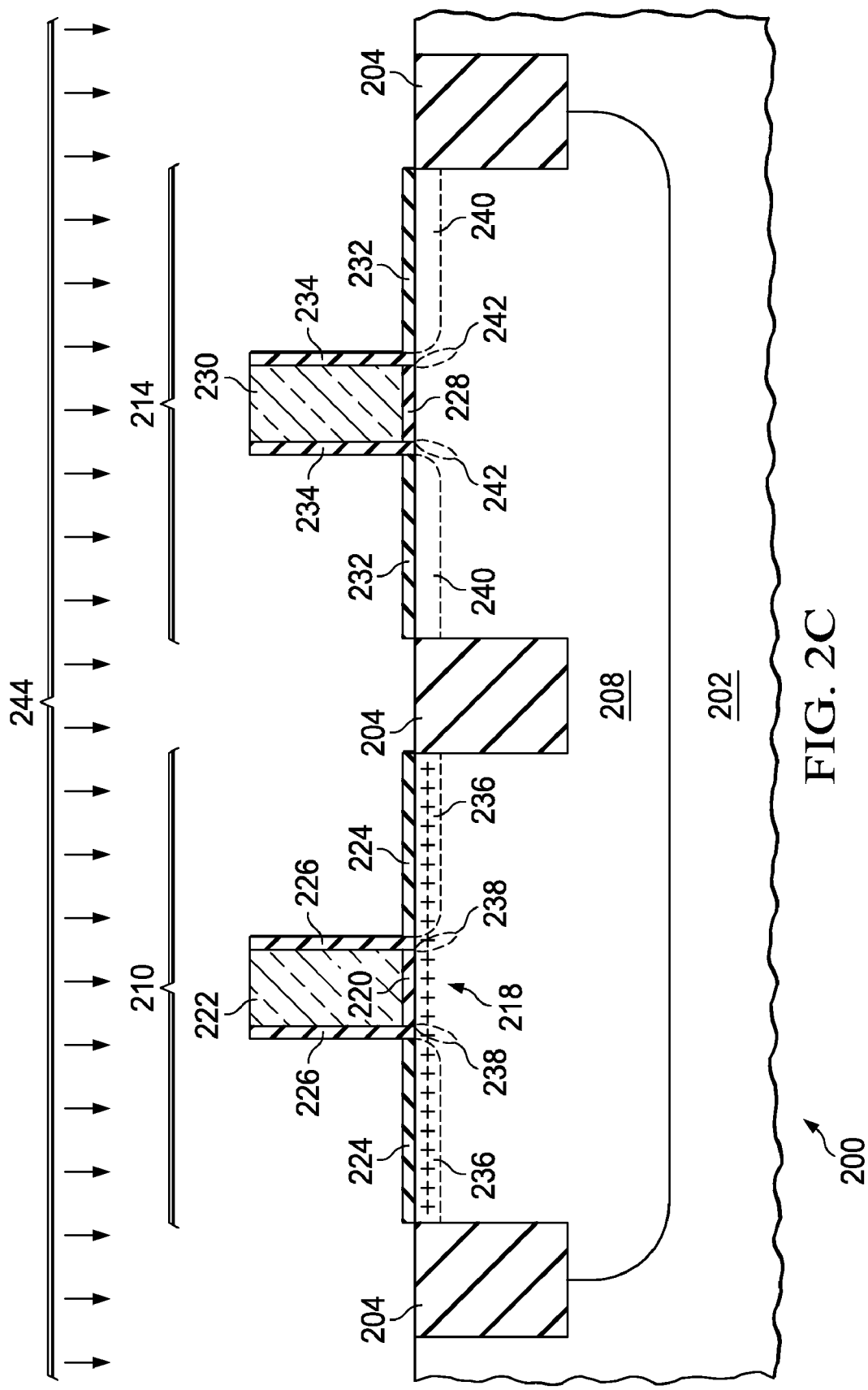

FIG. 2C depicts the IC (200) during formation of the high threshold NLDD regions (236), high threshold NMOS pocket regions (238), core NLDD regions (240) and core NMOS pocket regions (242). High threshold NLDD regions (236) are formed in a top region of the p-well (208) adjacent to the high threshold NLDD offset spacers (226) by ion implantation of n-type dopants (244), typically phosphorus and arsenic, at doses of $1 \cdot 10^{13}$ to $1 \cdot 10^{15}$ $cm^{-2}$, and commonly to a depth of 10 to 100 nanometers. P-type high threshold NMOS pocket regions (238) are formed between the high threshold NLDD regions (236) an a channel region in the p-well (208) immediately under the high threshold NMOS gate dielectric layer (220), by angled ion implantation of p-type dopants, typically boron, at doses of $1 \cdot 10^{11}$ to $1 \cdot 10^{13}$ $cm^{-2}$, and commonly to a depth of 10 to 100 nanometers. According to the instant invention, no carbon containing species are implanted into the high threshold NLDD regions (236), to reduce GDL due to mid-bandgap states in the high threshold NLDD space charge region. Similarly, core NLDD regions (240) are formed in a top region of the p-well (208) adjacent to the core NLDD offset spacers (234) by ion implantation of the n-type dopants (244). In another embodiment, the core NLDD regions (240) may be formed by a different implant from the high threshold NLDD regions (236). P-type core NMOS pocket regions (242) are formed between the core NLDD regions (240) an a channel region in the p-well (208) immediately under the core NMOS gate dielectric layer (228), by angled ion implantation of p-type dopants, typically boron, at doses of $1 \cdot 10^{11}$ to $1 \cdot 10^{13}$ $cm^{-2}$, and commonly to a depth of 10 to 100 nanometers.

It is common to anneal the high threshold NLDD, core NLDD, high threshold NMOS pocket and core NMOS pocket implants to reduce damage done to a silicon crystal lattice by the implant processes, and to activate a portion of the implanted dopants. In a preferred embodiment, the thermal profile (time and temperature) of this anneal is adjusted to achieve repair of the silicon crystal lattice while minimizing spreading of the implanted dopants by interstitial and vacancy diffusion. For example, an anneal of 900 C for 10 seconds may be sufficient to repair the silicon crystal lattice for subsequent processing.

Figure 2D:
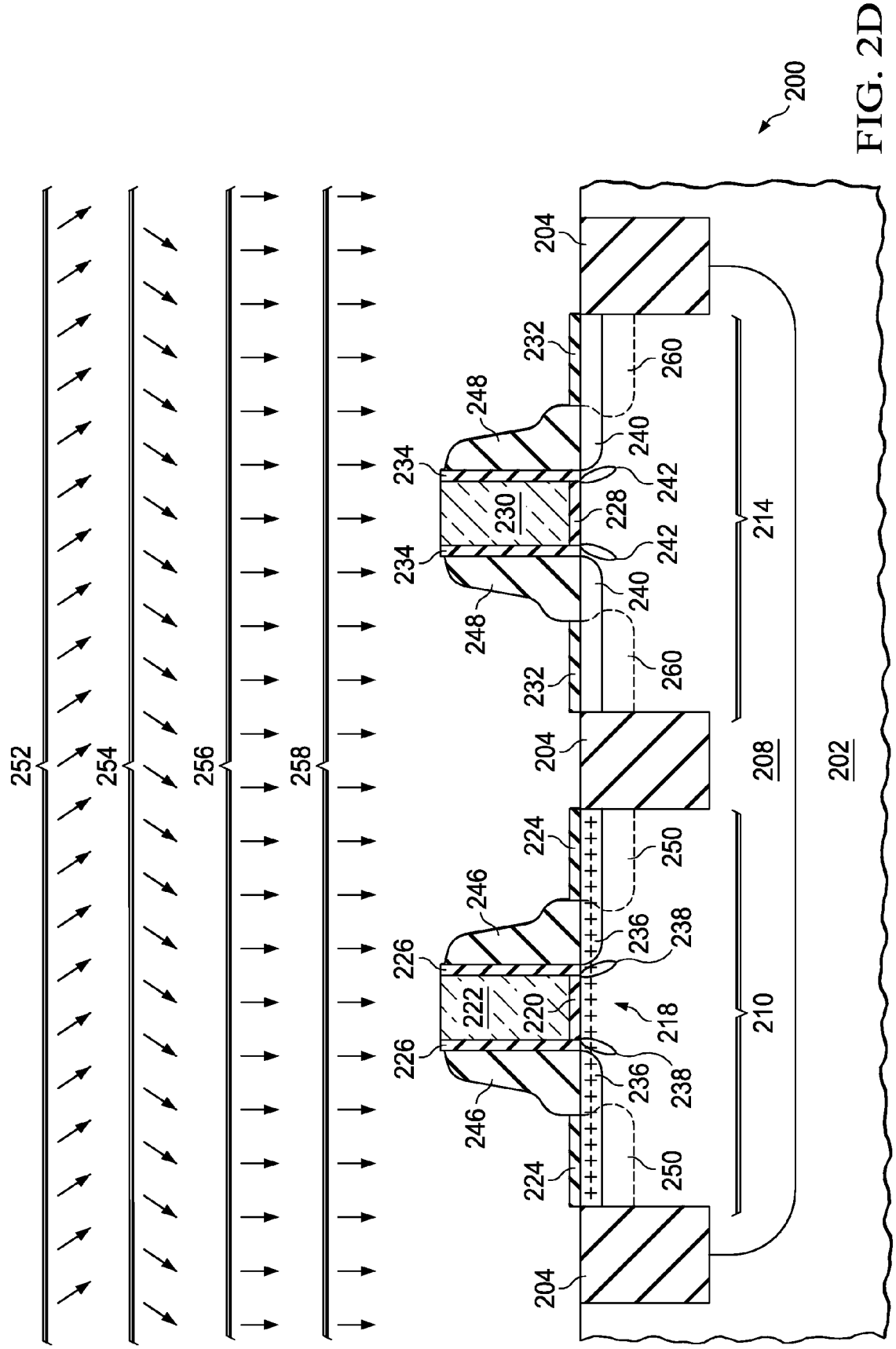

FIG. 2D depicts the IC (200) during the formation of high threshold NMOS and core NMOS source and drain regions. High threshold NMOS gate sidewall spacers (246) are formed on lateral surfaces of the high threshold NLDD offset spacers (226), typically 10 to 100 nanometers thick, and commonly formed by deposition of layers of silicon dioxide and silicon nitride followed by selective anisotropic etchback. Similarly, core NMOS gate sidewall spacers (248) are formed on lateral surfaces of the core NLDD offset spacers (234), typically 10 to 100 nanometers thick, commonly formed by deposition of layers of silicon dioxide and silicon nitride followed by selective anisotropic etchback. Typically, a thickness and a composition of the core NMOS gate sidewall spacers (248) are substantially the same as the high threshold NMOS gate sidewall spacers (246).

Still referring to FIG. 2D, formation of the high threshold NSD regions (250) is accomplished according to the instant embodiment of the instant invention by a sequence of ion implantation steps, including a PAI, of which two of the four angled quarter dose implants are depicted in FIG. 2D as elements (252, 254), a carbon implant (256), and a phosphorus implant (258), followed by an NSD anneal. Typically, the core NSD regions (260) are formed by the same implants. However, in other embodiments, a high threshold NSD photoresist pattern exposes the high threshold NMOS region (210) to ion implantation while blocking the implants from the core NMOS region (214).

Figure 2E:
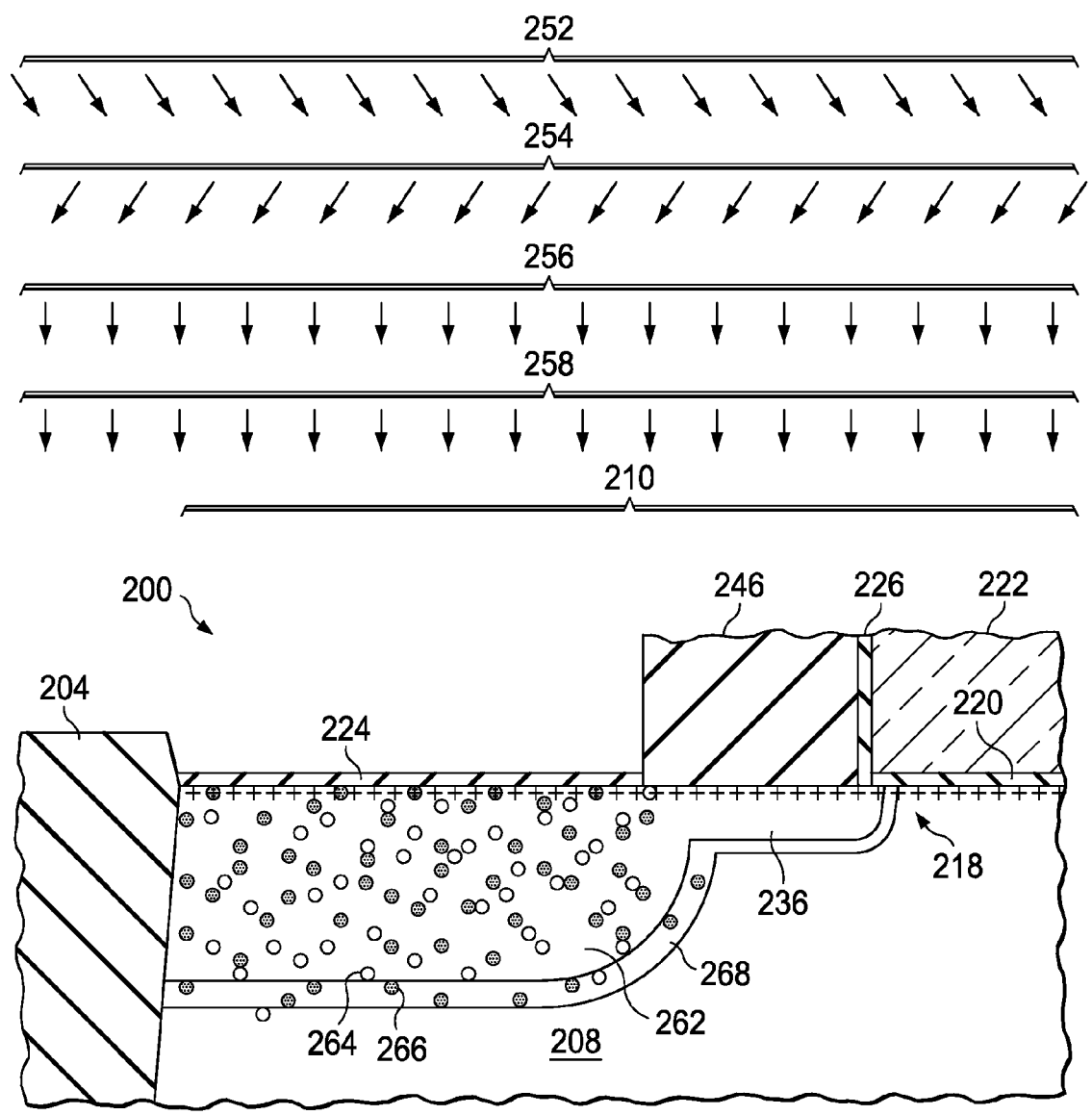

FIG. 2E depicts one side of the high threshold NMOS region to more clearly explain the PAI, the carbon implant, the phosphorus implant and the NSD anneal.

Referring to FIG. 2E, the purpose of the PAI is to amorphize a region at the top surface of the p-well (208) adjacent to the high threshold NMOS gate sidewall spacers (246). A species implanted in a PAI may be chosen from a long list of materials, including group IV elements such as germanium or silicon, heavy dopant atoms such as antimony or indium, or inert gases such as argon. In a further embodiment, a dose of the PAI is greater than $1·10^{15}$ cm$^{-2}$. PAI processes typically tilt an ion implant beam at an angle to the top surface of the p-well to avoid channeling a first group of atoms. Angled implants result in shadowed regions adjacent to structures over the top surface of the p-well, such as the NMOS gate or a photoresist pattern, so angled implants such as a PAI are commonly divided into four equal doses and each is implanted a same tilt angle that is rotated at 90 degree intervals around a vertical axis with respect to the top surface of the p-well. A first angled quarter dose, of four, of an NSD PAI is schematically depicted as element (252). A second angled quarter dose, of four, of the NSD PAI is schematically depicted by (254). The PAI implants form a high threshold NSD amorphous layer (262) in the top surface of the p-well (208) adjacent to the high threshold NMOS gate sidewall spacer (246). The high threshold NSD amorphous layer (262) is deeper than the high threshold NLDD layer because the high threshold NSD will be deeper than the high threshold NLDD.

Still referring to FIG. 2E, the purpose of the carbon implant is to inhibit phosphorus diffusion. A high threshold NSD carbon species implant, depicted schematically as element (256) places carbon atoms (264) in the top region of the p-well (208) adjacent to the high threshold NMOS gate sidewall spacer (246). An ion energy of the high threshold NSD carbon species implant (256) is adjusted to place the majority of the carbon atoms (264) in the high threshold NSD amorphous layer (262), using well known techniques. In a further embodiment, a dose of the high threshold NSD carbon species implant (256) is more than $2·10^{14}$ cm$^{-2}$. An alternate embodiment includes a dose greater than $5·10^{14}$ cm$^{-2}$ to further reduce phosphorus diffusion.

Still referring to FIG. 2E, formation of the high threshold NSD continues with ion implantation of phosphorus atoms (258) into the top region of the p-well (208) adjacent to the NMOS gate sidewall spacer (246) to provide n-type dopants for the high threshold NSD, in the form of phosphorus atoms (266). The use of phosphorus rather than arsenic for n-type dopants for the high threshold NSD is advantageous because it avoids the damage done by arsenic implantation, which is associated with pipe formation during metal silicidation, resulting in excess high threshold NMOS transistor off-state current leakage. An ion energy of the high threshold NSD phosphorus implant (258) is adjusted to place the majority of the phosphorus atoms (266) in the high threshold NSD amorphous layer (262), using well known techniques. Channeling of phosphorus atoms is significantly reduced by the presence of the high threshold NSD amorphous layer (262). A dose of the high threshold NSD phosphorus implant (258) is commonly in the range of $1·10^{14}$ to $3·10^{16}$ cm$^{-2}$, as determined by the performance requirements of the transistor.

Still referring to FIG. 2E, the purpose of the NSD anneal is to repair the damage to the silicon crystal done by the high threshold NSD PAI, high threshold NSD carbon species implant and high threshold NSD phosphorus implant, and activate a plurality of the phosphorus atoms (266) as n-type dopants. Activation of the phosphorus atoms as n-type dopants forms the NSD (268), which is an n-type region in the top region of the p-well (208) adjacent to the NMOS gate sidewall spacer (246). During the NSD anneal, as the high threshold NSD amorphous region crystallizes, carbon atoms (264) and phosphorus atoms (266) occupy substitutional sites. Substitutional carbon atoms rapidly exchange places with interstitial silicon, reducing the concentration of interstitial silicon at a boundary between the high threshold NSD amorphous and p-well crystalline regions. The resultant reduction of interstitial silicon results in formation of fewer interstitial phosphorus atoms, which in turn results in less phosphorus interstitial diffusion compared to a high threshold NSD with no implanted carbon atoms. This is advantageous because reduced phosphorus diffusion results in higher high threshold NMOS transistor on-state drive current and lower high threshold NMOS transistor off-state leakage current. An additional advantage of the instant embodiment accrues from the presence of carbon atoms from the high threshold NSD carbon species implant in the region of the high threshold NLDD, which reduce phosphorus diffusion in the high threshold NLDD and boron diffusion in the high threshold NMOS pocket regions during the NSD anneal. In one embodiment, a dose of arsenic implanted into the high threshold NLDD is reduced to less than $5·10^{14}$ cm$^{-2}$ and a dose of phosphorus implanted into the high threshold NLDD is increased to take advantage of the reduced diffusion in the high threshold NLDD due to the presence of carbon atoms in the high threshold NLDD and to reduce pipe defects associated with arsenic implantation.

A further advantage of the instant embodiment accrues from the fact that a higher concentration of phosphorus may be obtained in the high threshold NSD through the use of the carbon species ion implant than without, resulting in a desirable lower series resistance in the high threshold NMOS transistor.

It will be recognized by workers in transistor fabrication that the order of the high threshold NSD carbon species implant and the high threshold NSD phosphorus implant may be exchanged without loss of the benefits of the instant embodiment.

Figure 2F:
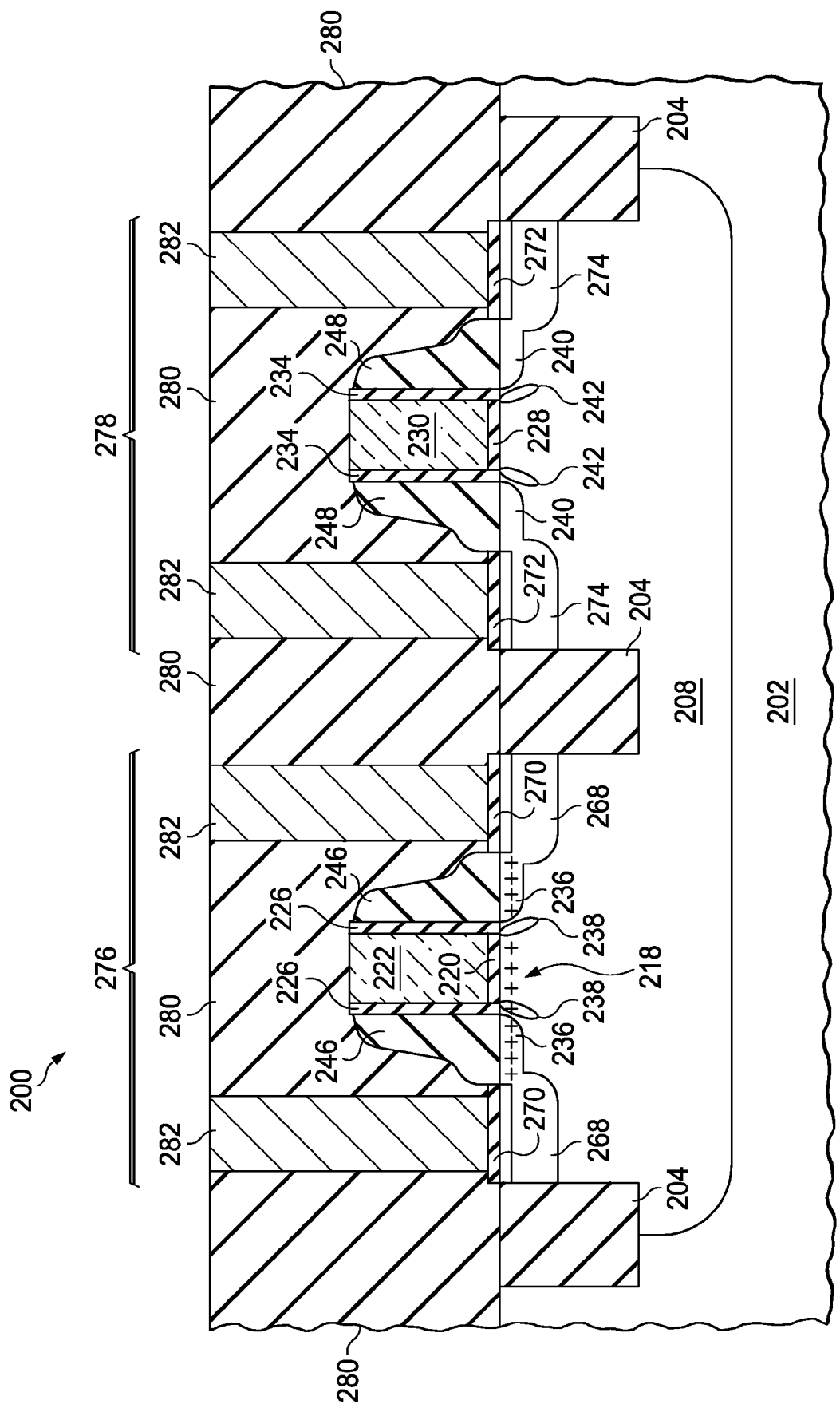

FIG. 2F depicts the IC (200) after completion of the high threshold NMOS and core NMOS transistors, and formation of contacts. Metal silicide (270, 272), typically nickel silicide, cobalt silicide or titanium silicide, is formed on top surfaces of the high threshold NSD (268) and core PSD (274), respectively, commonly by a process of deposition of a metal, such as nickel, cobalt or titanium, reaction at an elevated temperature to form a metal silicide in regions where the metal is in contact with silicon, such as the source and drain regions of MOS transistors, followed by selective removal of unreacted metal, and frequently followed by a second thermal process to achieve desired properties in the metal silicide, such as sheet resistance. A purpose of metal silicide formation is to reduce series resistances in MOS transistors.

Still referring to FIG. 2F, the high threshold NMOS gate dielectric layer (218), high threshold NMOS gate (222), high threshold NLDD offset spacers (226), high threshold NLDD regions (236), high threshold NMOS pocket regions (238), high threshold NMOS gate sidewall spacers (142), high threshold NSD regions (268) and high threshold NSD metal silicide layers (270) form a high threshold NMOS transistor (276). Similarly, the core NMOS gate dielectric layer (228), core NMOS gate (230), core NLDD offset spacers (234), core NLDD regions (240), core NMOS pocket regions (242), core NMOS gate sidewall spacers (248), core NSD regions (274) and core NSD metal silicide layers (272) form a core NMOS transistor (278).

Continuing to refer to FIG. 2F, fabrication of the IC (200) continues with formation of a pre-metal dielectric (PMD) layer (280), typically 5 to 50 nanometers of a silicon nitride containing layer, capped with 300 to 1000 nanometers of silicon dioxide. Contacts (282), are formed by patterning and etching contact holes through the PMD to expose the metal silicide layers (270, 272), and filled with metal, typically tungsten, but in some cases aluminum or copper, commonly by a process of deposition followed by selective removal from a top surface of the PMD (280). The contacts (282) connect the high threshold NMOS transistor (276) and core NMOS transistor (278) to other components in the IC (200) by metal interconnects (not shown).

Figure 3A:
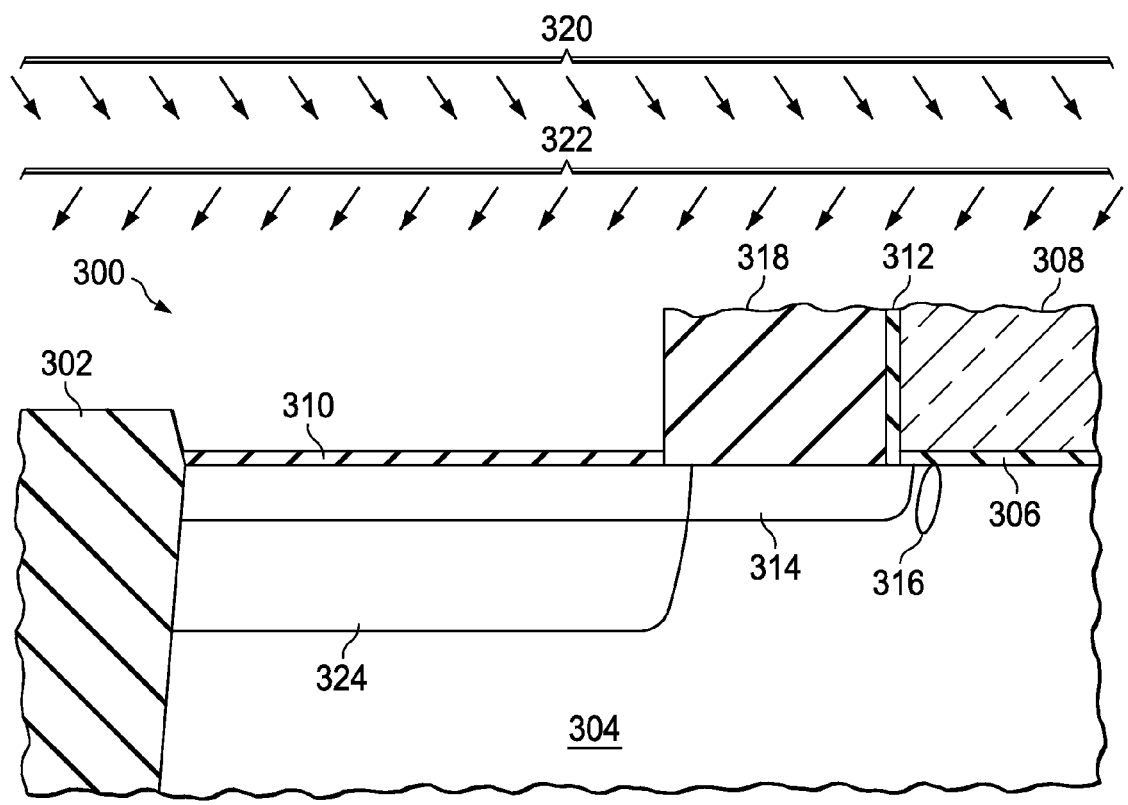
FIG. 3A through FIG. 3E depict an one side of an NMOS transistor in an IC during fabrication of the NSD including an arsenic ion implant according to the instant embodiment.

In a further embodiment, an NMOS transistor is formed in which arsenic is implanted into the NSD with a total dose less than $1 \cdot 10^{14}$ cm$^{-2}$. FIG. 3A through FIG. 3E depict one side of an NMOS transistor in an IC during fabrication of the NSD including an arsenic ion implant according to the instant embodiment. FIG. 3A depicts the NMOS transistor during a PAI process. IC (300) includes regions of field oxide (302), typically silicon dioxide, commonly fabricated by shallow trench isolation (STI) processes or less commonly local oxidation of silicon (LOCOS) processes, formed in the IC (300) to separate transistors and other components. IC (300) also includes a p-well (304), typically formed by ion implantation of p-type dopants, most commonly boron or BF$_2$, in several steps with doses from $1 \cdot 10^{10}$ cm$^{-2}$ to $1 \cdot 10^{13}$ cm$^{-2}$, at energies from 5 keV to 300 keV. An NMOS gate dielectric layer (306), typically silicon dioxide, nitrogen doped silicon dioxide, silicon oxy-nitride, hafnium oxide, layers of silicon dioxide and silicon nitride, or other insulating material, commonly 1.2 to 2.5 nanometers thick, is formed on a top surface of the p-well (304). An NMOS gate (308) is formed by deposition of gate material, typically polycrystalline silicon, commonly known as polysilicon, on a top surface of the NMOS gate dielectric layer (306), followed by formation of a photoresist pattern to define the NMOS gate region, followed by an etch process to removed unwanted gate material. An NMOS residual oxide layer (310) is formed on the top surface of the p-well (304) adjacent to the NMOS gate (308). NLDD offset spacers (312), typically 3 to 10 nanometers thick, are formed on lateral surfaces of the NMOS gate (308), commonly by growth and/or deposition of silicon dioxide and/or silicon nitride followed by selective anisotropic etchback. NLDD regions (314) are formed in a top region of the p-well (304) adjacent to the NLDD offset spacers (312), typically by ion implantation of phosphorus and arsenic, at doses of $1 \cdot 10^{13}$ to $1 \cdot 10^{15}$ cm$^{-2}$, commonly at depths of 10 to 100 nanometers. According to the instant invention, no carbon containing species are implanted into the NLDDs (314), to reduce GDL due to mid-bandgap states in the NLDD space charge region. P-type NMOS pocket regions (316) are formed between the NLDD regions (314) and a channel region in the p-well (304) immediately under the NMOS gate dielectric layer (306), by angled ion implantation of p-type dopants such as boron and gallium, at doses of $1 \cdot 10^{11}$ to $1 \cdot 10^{13}$ cm$^{-2}$, and commonly to a depth of 10 to 100 nanometers.

It is common to anneal the NLDD, PLDD, NMOS pocket and PMOS pocket implants to reduce damage done to a silicon crystal lattice by the implant processes, and to activate a portion of the implanted dopants. In a preferred embodiment, the thermal profile (time and temperature) of this anneal is adjusted to achieve repair of the silicon crystal lattice while minimizing spreading of the implanted dopants by interstitial and vacancy diffusion. For example, an anneal of 900 C for 10 seconds may be sufficient to repair the silicon crystal lattice for subsequent processing.

Still referring to FIG. 3A, NMOS gate sidewall spacers (318) are formed on lateral surfaces of the NLDD offset spacers (312), typically 10 to 100 nanometers thick, commonly formed by deposition of layers of silicon dioxide and silicon nitride followed by selective anisotropic etchback.

Continuing to refer to FIG. 3A, formation of the NSD regions is accomplished according to the instant embodiment by a sequence of ion implantation steps, including a PAI, a carbon implant, a phosphorus implant and an arsenic implant at a dose less than $1 \cdot 10^{14}$ cm$^{-2}$, followed by an NSD anneal. The purpose of the PAI is to amorphize a region at the top surface of the p-well (304) adjacent to the NMOS gate sidewall spacers (318). A species implanted in a PAI may be chosen from a long list of materials, including group IV elements such as germanium or silicon, heavy dopant atoms such as antimony or indium, or inert gases such as argon. In a further embodiment, a dose of the PAI is greater than $1 \cdot 10^{15}$ cm$^{-2}$. PAI processes typically tilt an ion implant beam at an angle to the top surface of the p-well to avoid channeling a first group of atoms. Angled implants result in shadowed regions adjacent to structures over the top surface of the p-well, such as the NMOS gate or a photoresist pattern, so angled implants such as a PAI are commonly divided into four equal doses and each is implanted a same tilt angle that is rotated at 90 degree intervals around a vertical axis with respect to the top surface of the p-well. A first angled quarter dose, of four, of an NSD PAI is schematically depicted in FIG. 3A by (320). A second angled quarter dose, of four, of the NSD PAI is schematically depicted by (322). The PAI implants form an NSD amorphous layer (324) in the top surface of the p-well (304) adjacent to the NMOS gate sidewall spacers (318). The NSD amorphous layer (324) is deeper than the NLDD region (314) because the NSD will be deeper than the NLDD.

Figure 3B:
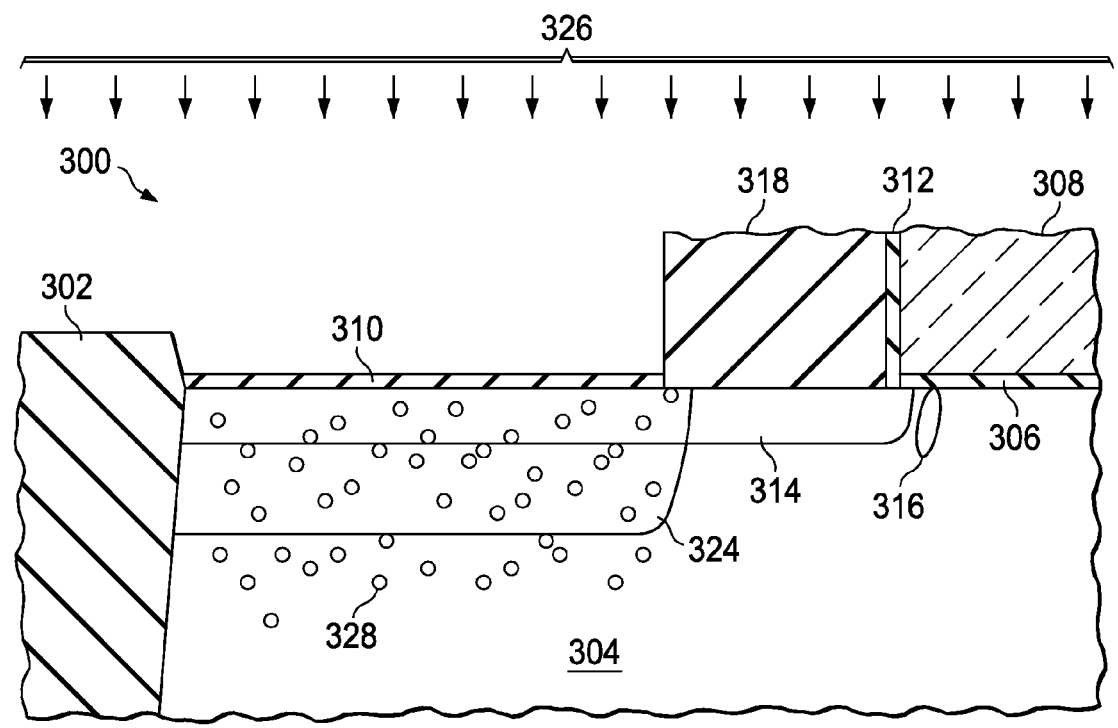

FIG. 3B depicts one side of the NMOS transistor during a carbon ion implantation process. The purpose of the carbon implant is to inhibit phosphorus diffusion. An NSD carbon species implant (326) places carbon atoms (328) in the top region of the p-well (304) adjacent to the NMOS gate sidewall spacer (318). An ion energy of the NSD carbon species implant (326) is adjusted to place the majority of the carbon atoms (328) in the NSD amorphous layer (324), using well known techniques. In a further embodiment, a dose of the NSD carbon species implant (326) is more than $2 \cdot 10^{14}$ cm$^{-2}$. An alternate embodiment includes a dose greater than $5 \cdot 10^{14}$ cm$^{-2}$ to further reduce phosphorus diffusion.

Figure 3C:
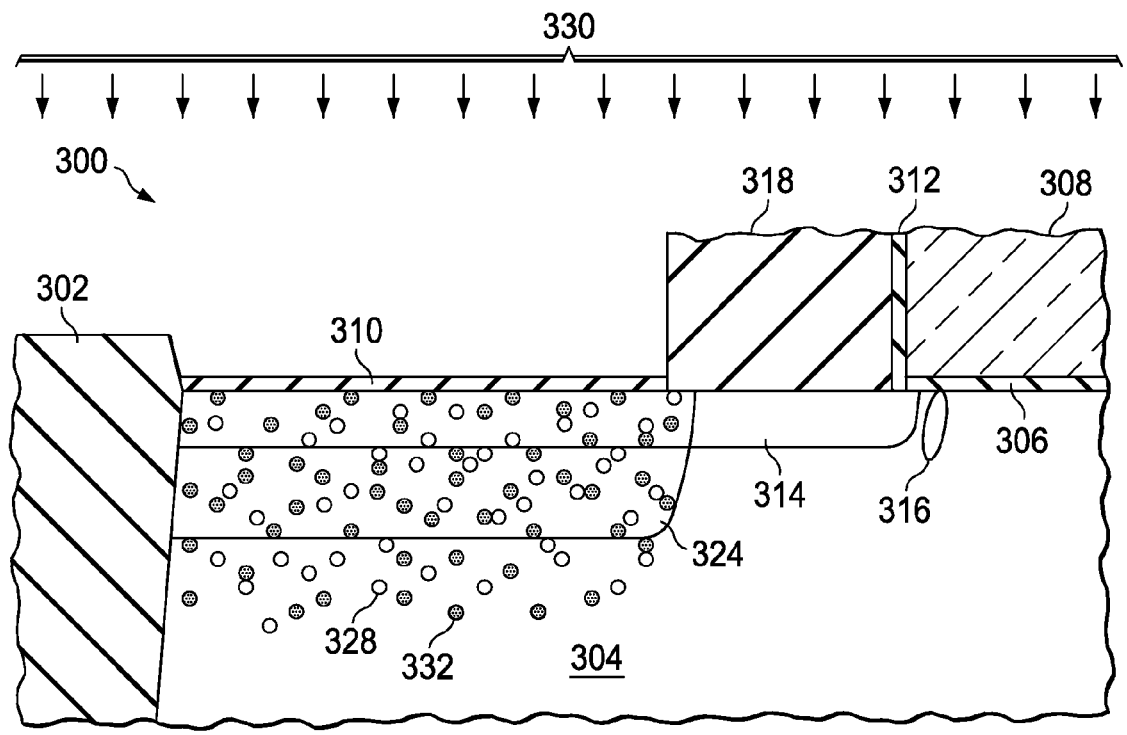

FIG. 3C depicts one side of the NMOS transistor during a phosphorus ion implantation process. Formation of the NSD continues with ion implantation of phosphorus atoms (330) into the top region of the p-well (304) adjacent to the NMOS gate sidewall spacer (318) to provide n-type dopants for the NSD, in the form of phosphorus atoms (332). The use of phosphorus rather than arsenic for n-type dopants for the NSD is advantageous because it avoids the damage done by arsenic implantation, which is associated with pipe formation during metal silicidation, resulting in excess transistor off-state current leakage. An ion energy of the NSD phosphorus implant (330) is adjusted to place the majority of the phosphorus atoms (332) in the NSD amorphous layer (324), using well known techniques. Channeling of phosphorus atoms is significantly reduced by the presence of the NSD amorphous layer (324). A dose of the NSD phosphorus implant (330) is commonly in the range of $1 \cdot 10^{14}$ to $3 \cdot 10^{16}$ cm$^{-2}$, as determined by the performance requirements of the transistor.

Figure 3D:
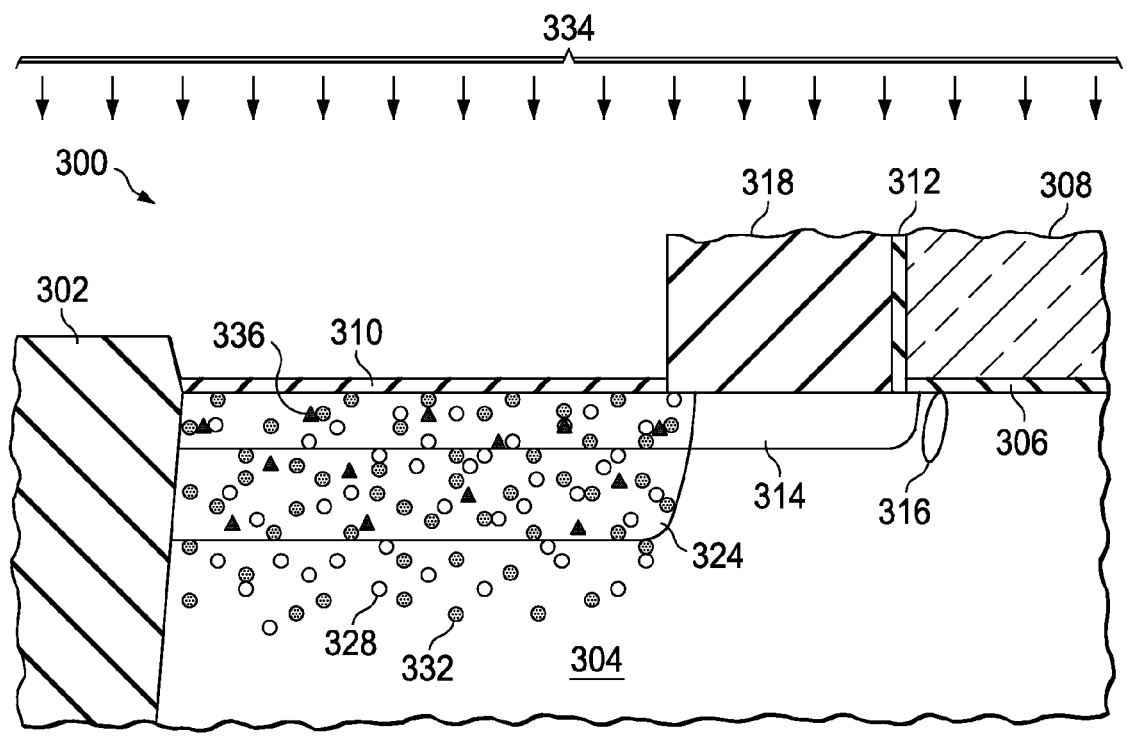

FIG. 3D depicts one side of the NMOS transistor during an arsenic ion implantation process. In the instant embodiment, an NSD arsenic implant (334) places arsenic atoms (336) in the top region of the p-well (304) adjacent to the NMOS gate sidewall spacer (318). An ion energy of the NSD arsenic implant has been adjusted to place the majority of the arsenic atoms (336) in the NSD amorphous layer (324), using well known techniques. A dose of the NSD arsenic implant may range up to $1 \cdot 10^{14}$ cm$^{-2}$, and is less than commonly practiced, due to the presence of significant amounts of phosphorus atoms (332) enabled by the instant invention. The use of arsenic in the instant embodiment is advantageous because it reduces a series resistance of the NMOS transistor, while limiting the dose to less than $1 \cdot 10^{14}$ cm$^{-2}$, is advantageous because it reduces pipe defect formation compared to NSD regions formed with higher arsenic doses.

Figure 3E:
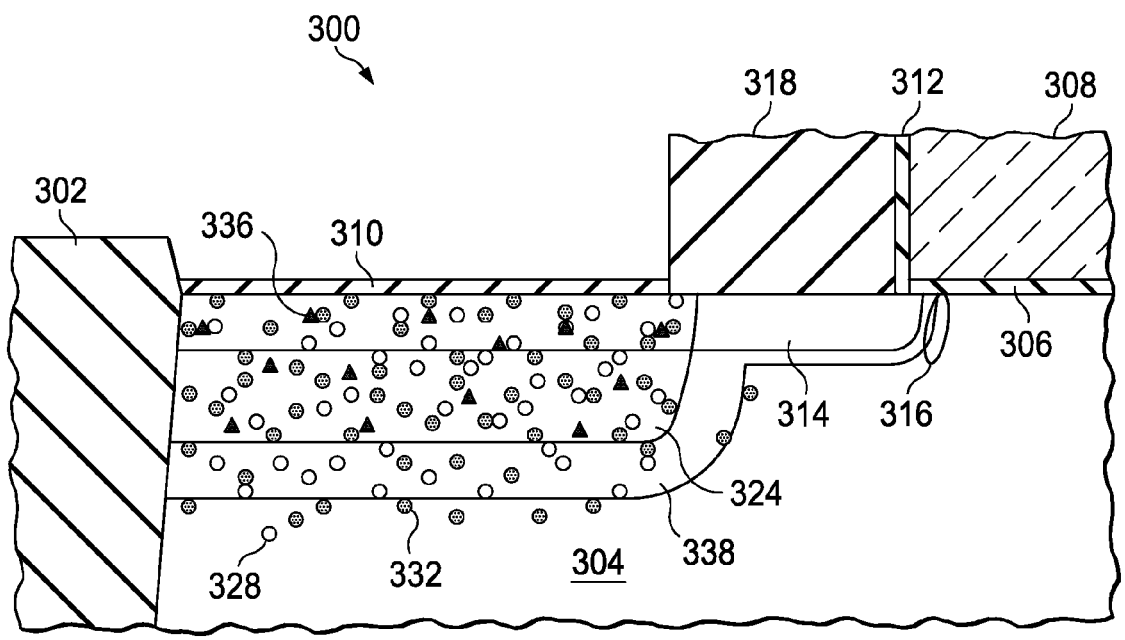

FIG. 3E depicts one side of the NMOS transistor after an NSD anneal process. The purpose of the NSD anneal is to repair the damage to the silicon crystal done by the NSD PAI, NSD carbon species implant, NSD phosphorus implant and NSD arsenic implant, and activate a plurality of the phosphorus atoms (332) and arsenic atoms (336) as n-type dopants. Activation of the phosphorus atoms (332) and arsenic atoms (336) as n-type dopants forms the NSD (338), which is an n-type region in the top region of the p-well (304) adjacent to the NMOS gate sidewall spacer (318). During the NSD anneal, as the NSD amorphous region crystallizes, carbon atoms (328), phosphorus atoms (332) and arsenic atoms (336) occupy substitutional sites. Substitutional carbon atoms rapidly exchange places with interstitial silicon, reducing the concentration of interstitial silicon at a boundary of the NSD amorphous and p-well crystalline regions. The resultant reduction of interstitial silicon results in formation of fewer interstitial phosphorus atoms and arsenic atoms, which in turn results in less phosphorus and arsenic interstitial diffusion compared to an NSD with no implanted carbon atoms. This is advantageous because reduced phosphorus and arsenic diffusion results in higher NMOS transistor on-state drive current and lower NMOS transistor off-state leakage current. An additional advantage of the instant embodiment accrues from the presence of carbon atoms from the NSD carbon species implant in the region of the NLDD, which reduce phosphorus and arsenic diffusion in the NLDD and boron diffusion in the NMOS pocket regions during the NSD anneal. In one embodiment, a dose of arsenic implanted into the NLDD is reduced to less than $5 \cdot 10^{14}$ cm$^{-2}$ and a dose of phosphorus implanted into the NLDD is increased to take advantage of the reduced diffusion in the NLDD due to the presence of carbon atoms in the NLDD and to reduce pipe defects associated with arsenic implantation.

A further advantage of the instant embodiment accrues from the fact that a higher concentration of phosphorus may be obtained in the NSD through the use of the carbon species ion implant than without, resulting in a desirable lower series resistance in the NMOS transistor.

It will be recognized by workers in transistor fabrication that the order of the NSD carbon species implant, the NSD phosphorus implant and the NSD arsenic implant may be exchanged without loss of the benefits of the instant embodiment.

Figure 4A:
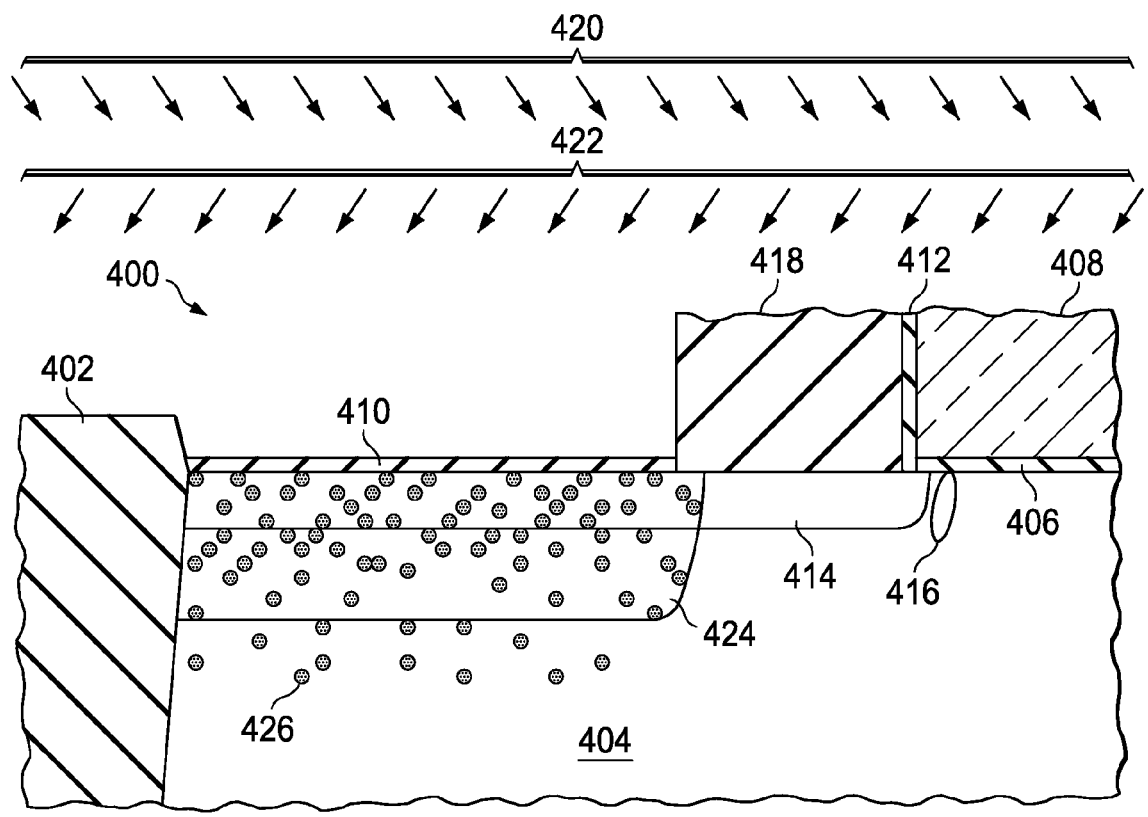
FIG. 4A through FIG. 4C depict one side of an NMOS transistor in an IC during fabrication of the NSD including a phosphorus PAI according to the instant embodiment.
Figure 4B:
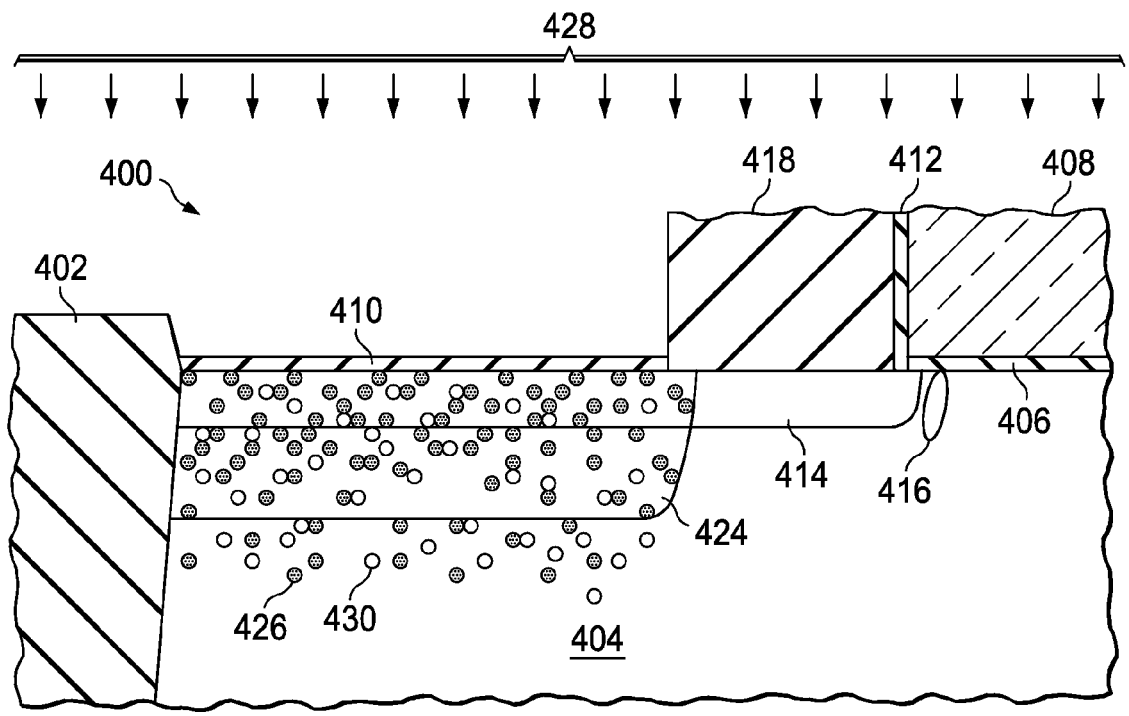
Figure 4C:
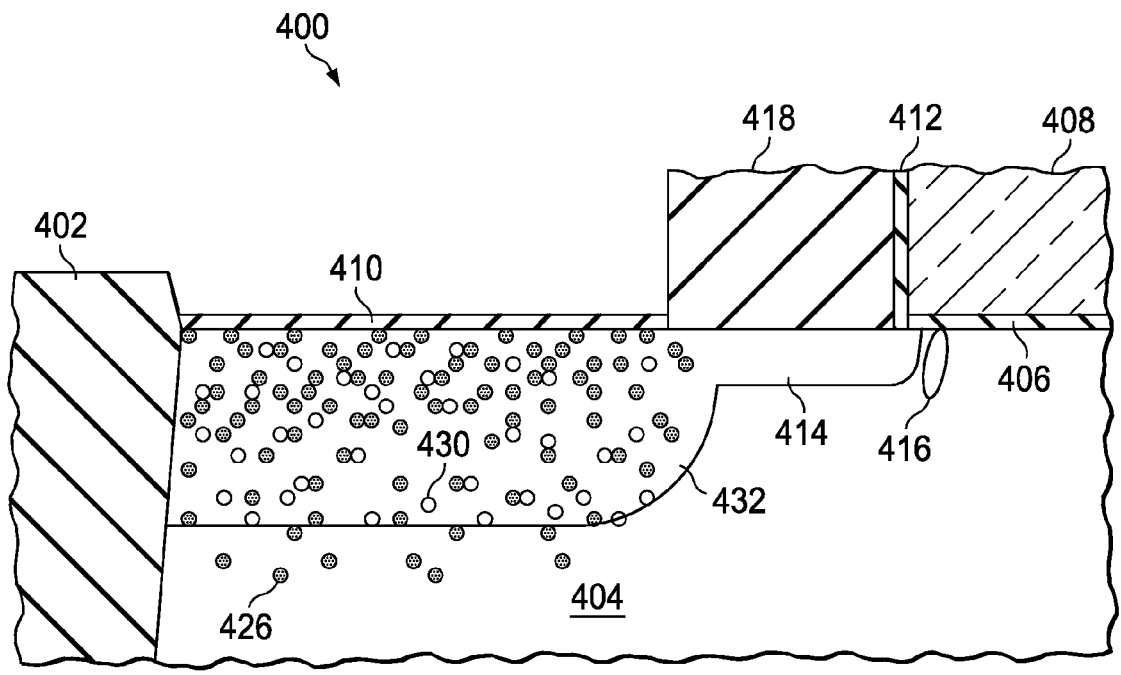

In another embodiment, an NMOS transistor is formed in which an NSD PAI is performed with phosphorus atoms. FIG. 4A through FIG. 4C depict one side of an NMOS transistor in an IC during fabrication of the NSD including a phosphorus PAI according to the instant embodiment. FIG. 4A depicts the NMOS transistor during the phosphorus PAI process. IC (400) includes regions of field oxide (402), typically silicon dioxide, commonly fabricated by shallow trench isolation (STI) processes or less commonly local oxidation of silicon (LOCOS) processes, formed in the IC (400) to separate transistors and other components. IC (300) also includes a p-well (404), typically formed by ion implantation of p-type dopants, most commonly boron or BF$_2$, in several steps with doses from $1 \cdot 10^{10}$ cm$^{-2}$ to $1 \cdot 10^{13}$ cm$^{-2}$, at energies from 5 keV to 300 keV. An NMOS gate dielectric layer (406), typically silicon dioxide, nitrogen doped silicon dioxide, silicon oxy-nitride, hafnium oxide, layers of silicon dioxide and silicon nitride, or other insulating material, commonly 1.2 to 2.5 nanometers thick, is formed on a top surface of the p-well (404). An NMOS gate (408) is formed by deposition of gate material, typically polycrystalline silicon, commonly known as polysilicon, on a top surface of the NMOS gate dielectric layer (406), followed by formation of a photoresist pattern to define the NMOS gate region, followed by an etch process to removed unwanted gate material. An NMOS residual oxide layer (410) is formed on the top surface of the p-well (404) adjacent to the NMOS gate (408). NLDD offset spacers (412), typically 3 to 10 nanometers thick, are formed on lateral surfaces of the NMOS gate (408), commonly by growth and/or deposition of silicon dioxide and/or silicon nitride followed by selective anisotropic etchback. NLDD regions (414) are formed in a top region of the p-well (404) adjacent to the NLDD offset spacers (412), typically by ion implantation of phosphorus and arsenic, at doses of $1 \cdot 10^{13}$ to $1 \cdot 10^{15}$ cm$^{-2}$, commonly at depths of 10 to 100 nanometers. According to the instant invention, no carbon containing species are implanted into the NLDDs (414), to reduce GDL due to mid-bandgap states in the NLDD space charge region. P-type NMOS pocket regions (416) are formed between the NLDD regions (414) and a channel region in the p-well (404) immediately under the NMOS gate dielectric layer (406), by angled ion implantation of p-type dopants such as boron and gallium, at doses of $1 \cdot 10^{11}$ to $1 \cdot 10^{13}$ cm$^{-2}$, and commonly to a depth of 10 to 100 nanometers.

It is common to anneal the NLDD, PLDD, NMOS pocket and PMOS pocket implants to reduce damage done to a silicon crystal lattice by the implant processes, and to activate a portion of the implanted dopants. In a preferred embodiment, the thermal profile (time and temperature) of this anneal is adjusted to achieve repair of the silicon crystal lattice while minimizing spreading of the implanted dopants by interstitial and vacancy diffusion. For example, an anneal of 900 C for 10 seconds may be sufficient to repair the silicon crystal lattice for subsequent processing.

Still referring to FIG. 4A, NMOS gate sidewall spacers (418) are formed on lateral surfaces of the NLDD offset spacers (412), typically 10 to 100 nanometers thick, commonly formed by deposition of layers of silicon dioxide and silicon nitride followed by selective anisotropic etchback.

Continuing to refer to FIG. 4A, formation of the NSD regions is accomplished according to the instant embodiment by a sequence of ion implantation steps, including a phosphorus PAI and a carbon implant, followed by an NSD anneal. A first purpose of the phosphorus PAI is to amorphize a region at the top surface of the p-well (404) adjacent to the NMOS gate sidewall spacers (418). A second purpose of the phosphorus PAI is to provide n-type dopants for the NSD, in the form of phosphorus atoms. The use of phosphorus atoms for the PAI is advantageous because it reduces process cost and complexity by eliminating the need for separate PAI and phosphorus ion implants. In a further embodiment, a dose of the PAI is greater than $1 \cdot 10^{15}$ cm$^{-2}$. PAI processes typically tilt an ion implant beam at an angle to the top surface of the p-well to avoid channeling a first group of atoms. Angled implants result in shadowed regions adjacent to structures over the top surface of the p-well, such as the NMOS gate or a photoresist pattern, so angled implants such as a PAI are commonly divided into four equal doses and each is implanted a same tilt angle that is rotated at 90 degree intervals around a vertical axis with respect to the top surface of the p-well. A first angled quarter dose, of four, of the NSD phosphorus PAI is schematically depicted in FIG. 4A by (420). A second angled quarter dose, of four, of the NSD phosphorus PAI is schematically depicted by (422). The NSD phosphorus PAI forms an NSD amorphous layer (424) in the top surface of the p-well (404) adjacent to the NMOS gate sidewall spacers (418). The NSD amorphous layer (424) is deeper than the NLDD region (414) because the NSD will be deeper than the NLDD. Phosphorus atoms (426) in the NSD amorphous layer (424) from the NSD phosphorus PAI provide n-type dopants for the NSD. A dose of the NSD phosphorus PAI is in the range of $1 \cdot 10^{14}$ to $3 \cdot 10^{16}$ cm$^{-2}$, as determined by the performance requirements of the transistor.

FIG. 4B depicts one side of the NMOS transistor during a carbon ion implantation process. The purpose of the carbon implant is to inhibit phosphorus diffusion. An NSD carbon species implant (428) places carbon atoms (430) in the top region of the p-well (404) adjacent to the NMOS gate sidewall spacer (418). An ion energy of the NSD carbon species implant (428) is adjusted to place the majority of the carbon atoms (430) in the NSD amorphous layer (424), using well known techniques. In a further embodiment, a dose of the NSD carbon species implant (428) is more than $2 \cdot 10^{14}$ cm$^{-2}$. An alternate embodiment includes a dose greater than $5 \cdot 10^{14}$ cm$^{-2}$ to further reduce phosphorus diffusion.

FIG. 4C depicts one side of the NMOS transistor after an NSD anneal process. The purpose of the NSD anneal is to repair the damage to the silicon crystal done by the NSD phosphorus PAI and NSD carbon species implant, and activate a plurality of the phosphorus atoms (426) as n-type dopants. Activation of the phosphorus atoms (426) as n-type dopants forms the NSD (432), which is an n-type region in the top region of the p-well (404) adjacent to the NMOS gate sidewall spacer (418). During the NSD anneal, as the NSD amorphous region crystallizes, carbon atoms (430) and phosphorus atoms (426) occupy substitutional sites. Substitutional carbon atoms rapidly exchange places with interstitial silicon, reducing the concentration of interstitial silicon at a boundary of the NSD amorphous and p-well crystalline regions. The resultant reduction of interstitial silicon results in formation of fewer interstitial phosphorus atoms, which in turn results in less phosphorus interstitial diffusion compared to an NSD with no implanted carbon atoms. This is advantageous because reduced phosphorus diffusion results in higher NMOS transistor on-state drive current and lower NMOS transistor off-state leakage current. An additional advantage of the instant embodiment accrues from the presence of carbon atoms from the NSD carbon species implant in the region of the NLDD, which reduce phosphorus and arsenic diffusion in the NLDD and boron diffusion in the NMOS pocket regions during the NSD anneal. In one embodiment, a dose of arsenic implanted into the NLDD is reduced to less than $5 \cdot 10^{14}$ cm$^{-2}$ and a dose of phosphorus implanted into the NLDD is increased to take advantage of the reduced diffusion in the NLDD due to the presence of carbon atoms in the NLDD and to reduce pipe defects associated with arsenic implantation.

A further advantage of the instant embodiment accrues from the fact that a higher concentration of phosphorus may be obtained in the NSD through the use of the carbon species ion implant than without, resulting in a desirable lower series resistance in the NMOS transistor.

It will be recognized by workers in transistor fabrication that the order of the NSD carbon species implant and the NSD phosphorus implant may be exchanged without loss of the benefits of the instant embodiment.

It will also be recognized that the embodiment including an arsenic implant into the NSD with a dose less than $1 \cdot 10^{14}$ cm$^{-2}$ may be combined with the instant embodiment to accrue the advantages of both embodiments.

The embodiment including an arsenic implant into the NSD with a dose less than $1 \cdot 10^{14}$ cm$^{-2}$ may be combined with the instant embodiment to form a high threshold NMOS transistor, thereby accruing the advantages of both embodiments in the high threshold NMOS transistor.

What is claimed is:

1. A method of forming an NMOS transistor, comprising the steps of:
    providing a semiconductor substrate;
    forming a p-type well in and extending to a top surface of said semiconductor substrate;
    forming an NMOS gate dielectric layer on a top surface of said p-type well;
    forming an NMOS gate on a top surface of said NMOS gate dielectric layer;
    forming NMOS gate sidewall spacers on lateral surfaces of said NMOS gate; and
    forming n-type source-drain (NSD) regions in said p-type well adjacent to said NMOS gate sidewall spacers by a process comprising the steps of:
        ion implanting a species of an atomic weight greater than 27 in a region at said top surface of said p-type well adjacent to said NMOS gate sidewall spacers;
        ion implanting a carbon containing species in a region at said top surface of said p-type well adjacent to said NMOS gate sidewall spacers; and
        ion implanting a first dopant species, distinct from said species of an atomic weight greater than 27, in a region at said top surface of said p-type well adjacent to NMOS said gate sidewall spacers.

2. The method of claim 1, in which said first dopant species is phosphorus.

3. The method of claim 2, in which said step of ion implanting a carbon containing species is performed with a dose higher than $2 \cdot 10^{14}$ cm$^{-2}$.

4. The method of claim 3, in which said step of forming NSD regions further comprises the step of ion implanting arsenic with a total dose of less than $1 \cdot 10^{14}$ cm$^{-2}$.

5. A method of forming an NMOS transistor, comprising the steps of:
    providing a semiconductor substrate;
    forming a p-type well in and extending to a top surface of said semiconductor substrate;
    forming an NMOS gate dielectric layer on a top surface of said p-type well;
    forming an NMOS gate on a top surface of said NMOS gate dielectric layer;
    forming NMOS gate sidewall spacers on lateral surfaces of said NMOS gate; and
    forming n-type source-drain (NSD) regions in said p-type well adjacent to said NMOS gate sidewall spacers by a process comprising the steps of:
        ion implanting a species of an atomic weight greater than 27 in a region at said top surface of said p-type well adjacent to said NMOS gate sidewall spacers, wherein said species of an atomic weight greater than 27 is phosphorus;
        ion implanting a carbon containing species in a region at said to surface of said p-type well adjacent to said NMOS gate sidewall spacers wherein; and
        ion implanting a first dopant species in a region at said to surface of said p-type well adjacent to NMOS said gate sidewall spacers, wherein said first dopant species is phosphorus.

6. The method of claim 5, in which said step of forming NSD regions further comprises the step of ion implanting arsenic with a total dose of less than $1 \cdot 10^{14}$ cm$^{-2}$.

7. A method of forming an integrated circuit, comprising the steps of:

providing a semiconductor substrate;
forming a p-type well in a first region of said semiconductor substrate and extending to a top surface of said semiconductor substrate;
forming an NMOS transistor in said p-type well by a process comprising the steps of:
   forming an NMOS gate dielectric layer on a top surface of said p-type well;
   forming an NMOS gate on a top surface of said NMOS gate dielectric layer;
   forming NMOS gate sidewall spacers on lateral surfaces of said NMOS gate; and
   forming n-type source-drain (NSD) regions in said p-type well adjacent to said NMOS gate sidewall spacers by a process comprising the steps of:
     performing a pre-amorphizing implant of a species into a region at said top surface of said p-type well adjacent to said NMOS gate sidewall spacers;
     ion implanting a carbon containing species in a region at said top surface of said p-type well adjacent to said NMOS gate sidewall spacers; and
     ion implanting a first dopant species in a region at said top surface of said p-type well adjacent to said gate sidewall spacers.

8. The method of claim 7, further comprising the steps of:
forming an n-type well in a second region of said semiconductor substrate and extending to a top surface of said semiconductor substrate, whereby said first region and said second region do not overlap;
forming a region of field oxide in said semiconductor substrate at a boundary between said p-type well and said n-type well;
forming a PMOS transistor in said n-type well;
forming a pre-metal dielectric (PMD) layer on a top surface of said NMOS transistor and a top surface of said PMOS transistor; and
forming contacts in said PMD layer connected to said NSD regions.

9. The method of claim 8, in which said first dopant species is phosphorus.

10. The method of claim 9, in which said step of ion implanting a carbon containing species is performed with a dose higher than $2 \cdot 10^{14}$ cm$^{-2}$.

11. The method of claim 10, in which said step of forming NSD regions further comprises the step of ion implanting arsenic with a total dose of less than $1 \cdot 10^{14}$ cm$^{-2}$.

12. The method of claim 10, in which said species of the pre-amorphizing implant is phosphorus.

13. The method of claim 12, in which said step of forming NSD regions further comprises the step of ion implanting arsenic with a total dose of less than $1 \cdot 10^{14}$ cm$^{-2}$.

14. The method of claim 10, in which said step of forming an NMOS transistor further comprises the step of ion implanting additional p-type dopants 1 to 30 nanometers deep at a dose of $1 \cdot 10^{10}$ cm$^{-2}$ to $1 \cdot 10^{12}$ cm$^{-2}$, and further comprising the step of forming a second NMOS transistor in said p-type well, in which a p-type dopant density under a gate dielectric layer of said second NMOS transistor is less than a p-type dopant density under said NMOS gate dielectric layer in said NMOS transistor.

15. An NMOS transistor, comprising:
a semiconductor substrate;
a p-type well formed in and extending to a top surface of said semiconductor substrate;
an NMOS gate dielectric layer formed on a top surface of said p-type well;
an NMOS gate formed on a top surface of said NMOS gate dielectric layer;
NMOS gate sidewall spacers formed on lateral surfaces of said NMOS gate; and
n-type source-drain (NSD) regions formed in said p-type well adjacent to said NMOS gate sidewall spacers, comprising three distinct species:
   an ion implanted species of an atomic weight greater than 27 in a region at said top surface of said p-type well adjacent to said NMOS gate sidewall spacers;
   a carbon containing ion implanted species in a region at said top surface of said p-type well adjacent to said NMOS gate sidewall spacers; and
   ion implanted atoms of a first dopant species in a region at said top surface of said p-type well adjacent to said NMOS gate sidewall spacers.

16. The NMOS transistor of claim 15, in which said first dopant species is phosphorus.

17. The NMOS transistor of claim 16, in which a concentration of said carbon containing ion implanted species is higher than $2 \cdot 10^{14}$ cm$^{-2}$.

18. The NMOS transistor of claim 17, in which said NSD regions further comprise ion implanted arsenic with a concentration less than $1 \cdot 10^{14}$ cm$^{-2}$.

19. An NMOS transistor, comprising:
a semiconductor substrate;
a p-type well formed in and extending to a top surface of said semiconductor substrate;
an NMOS gate dielectric layer formed on a top surface of said p-type well;
an NMOS gate formed on a top surface of said NMOS gate dielectric layer;
NMOS gate sidewall spacers formed on lateral surfaces of said NMOS gate; and
n-type source-drain (NSD) regions formed in said p-type well adjacent to said NMOS gate sidewall spacers, comprising:
   an ion implanted species of an atomic weight greater than 27 in a region at said top surface of said p-type well adjacent to said NMOS gate sidewall spacers, wherein said species of an atomic weight greater than 27 is phosphorus;
   a carbon containing ion implanted species in a region at said top surface of said p-type well adjacent to said NMOS gate sidewall spacers; and
   ion implanted atoms of a first dopant species in a region at said top surface of said p-type well adjacent to said NMOS gate sidewall spacers; wherein said species of an atomic weight greater than 27 is phosphorus.

20. The NMOS transistor of claim 19, in which said NSD regions further comprise ion implanted arsenic with a concentration less than $1 \cdot 10^{14}$ cm$^{-2}$.

* * * * *